(12) United States Patent
Kondo et al.

(10) Patent No.: US 7,279,425 B2
(45) Date of Patent: *Oct. 9, 2007

(54) POLISHING METHOD

(75) Inventors: Seiichi Kondo, Kokubunji (JP); Yoshio Homma, Tokyo (JP); Noriyuki Sakuma, Hachiouji (JP); Kenichi Takeda, Tokorozawa (JP); Kenji Hinode, Hachiouji (JP)

(73) Assignee: Hitachi, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/581,375

(22) Filed: Oct. 17, 2006

(65) Prior Publication Data

US 2007/0029285 A1 Feb. 8, 2007

Related U.S. Application Data

(63) Continuation of application No. 10/441,063, filed on May 20, 2003, now Pat. No. 7,132,367, which is a continuation of application No. 09/618,999, filed on Jul. 18, 2000, now Pat. No. 6,596,638, which is a continuation of application No. 09/182,438, filed on Oct. 30, 1998, now Pat. No. 6,117,775.

(30) Foreign Application Priority Data

Oct. 31, 1997 (JP) .................................. 9-299937

(51) Int. Cl.
 *H01L 21/302* (2006.01)
(52) U.S. Cl. .................. 438/692; 438/693; 438/695; 438/697; 438/754

(58) Field of Classification Search ............... 438/691, 438/693, 695, 697, 754, 692
See application file for complete search history.

(56) References Cited

U.S. PATENT DOCUMENTS

| 4,944,836 A | 7/1990 | Beyer et al. |
| 5,532,094 A * | 7/1996 | Arimura et al. ............ 216/106 |
| 5,575,885 A | 11/1996 | Hirabayashi et al. |
| 5,674,443 A * | 10/1997 | Lee et al. ................ 264/210.6 |
| 5,676,760 A | 10/1997 | Aoki et al. .................. 134/1.3 |
| 5,695,660 A | 12/1997 | Litvak .......................... 216/85 |

(Continued)

FOREIGN PATENT DOCUMENTS

JP 06-295892 10/1994

(Continued)

OTHER PUBLICATIONS

English Translation of Official Action mailed Nov. 28, 2006, for Japanese Application No. 2003-205241.

(Continued)

*Primary Examiner*—Binh X. Tran
(74) *Attorney, Agent, or Firm*—Antonelli, Terry, Stout & Kraus, LLP

(57) ABSTRACT

A polishing technique wherein scratches, peeling, dishing and erosion are suppressed, a complex cleaning process and slurry supply/processing equipment are not required, and the cost of consumable items such as slurries and polishing pads is reduced. A metal film formed on an insulating film comprising a groove is polished with a polishing solution containing an oxidizer and a substance which renders oxides water-soluble, but not containing a polishing abrasive.

27 Claims, 26 Drawing Sheets

U.S. PATENT DOCUMENTS

| | | | |
|---|---|---|---|
| 5,733,176 A | 3/1998 | Robinson et al. | 451/41 |
| 5,759,917 A | 6/1998 | Grover | 438/690 |
| 5,770,095 A | 6/1998 | Sasaki et al. | |
| 5,783,489 A | 7/1998 | Kaufman et al. | 438/692 |
| 5,840,629 A | 11/1998 | Carpio | 438/692 |
| 5,858,813 A | 1/1999 | Scherber et al. | 438/693 |
| 5,866,031 A | 2/1999 | Carpio et al. | 252/79.1 |
| 5,875,507 A | 3/1999 | Stephens | |
| 5,885,477 A * | 3/1999 | Rasmussen et al. | 252/79.2 |
| 5,932,486 A | 8/1999 | Cook et al. | |
| 5,954,997 A | 9/1999 | Kaufman et al. | |
| 5,972,792 A | 10/1999 | Hudson | |
| 5,981,454 A * | 11/1999 | Small | 510/175 |
| 6,001,269 A | 12/1999 | Suthuraman et al. | |
| 6,117,775 A | 9/2000 | Kondo et al. | |
| 6,117,783 A * | 9/2000 | Small et al. | 438/693 |
| 6,126,853 A | 10/2000 | Kaufman et al. | |
| 6,596,638 B1 * | 7/2003 | Kondo et al. | 438/690 |
| 7,132,367 B2 * | 11/2006 | Kondo et al. | 438/691 |

FOREIGN PATENT DOCUMENTS

| | | |
|---|---|---|
| JP | 07-094455 | 4/1995 |
| JP | 07-161669 | 6/1995 |
| JP | 07-233485 | 9/1995 |
| JP | 08-083780 | 3/1996 |
| JP | 11-135466 | 5/1999 |
| JP | 2001-502610 | 2/2001 |
| WO | WO 98/18159 | 4/1998 |

OTHER PUBLICATIONS

Official Action dated Oct. 10, 2006, for Japanese Application No. 2003-115184 (English translation only).

"Pattern Geometry Effects in the Chemical-Mechanical Polishing of Inlaid Copper Structures", J. Electrochem. Soc., vol. 141, p. 2842-2848, Oct. 10, 1994.

"An Examination of Slurry for Wiring Metal's Chemical-Mechanical Polishing", vol. 41, p. 35-37, Jun. 1997 (in Japanese).

"Semiconductor International", Semiconductor World, p. 171-172, May 1995 (in Japanese).

"Electrochemical Potential Measurements during the Chemical-Mechanical Polishing of Copper Thin Films", J.E. Electrochem. Soc., vol. 142, Jul. 7, 1995 p. 2379-2385.

"Chemical Mechanical Polishing of Copper using a Slurry composed of glycine and hydrogen peroxide", CMP-MIC Conferences 1996 ISMIC, Feb. 22-23, 1996, CMP p. 119-123.

Kashiwagi, *The Science of CMP* (1997), p. 299-300.

* cited by examiner

Dishing

Erosion

With alumina abrasive

Without alumina abrasive

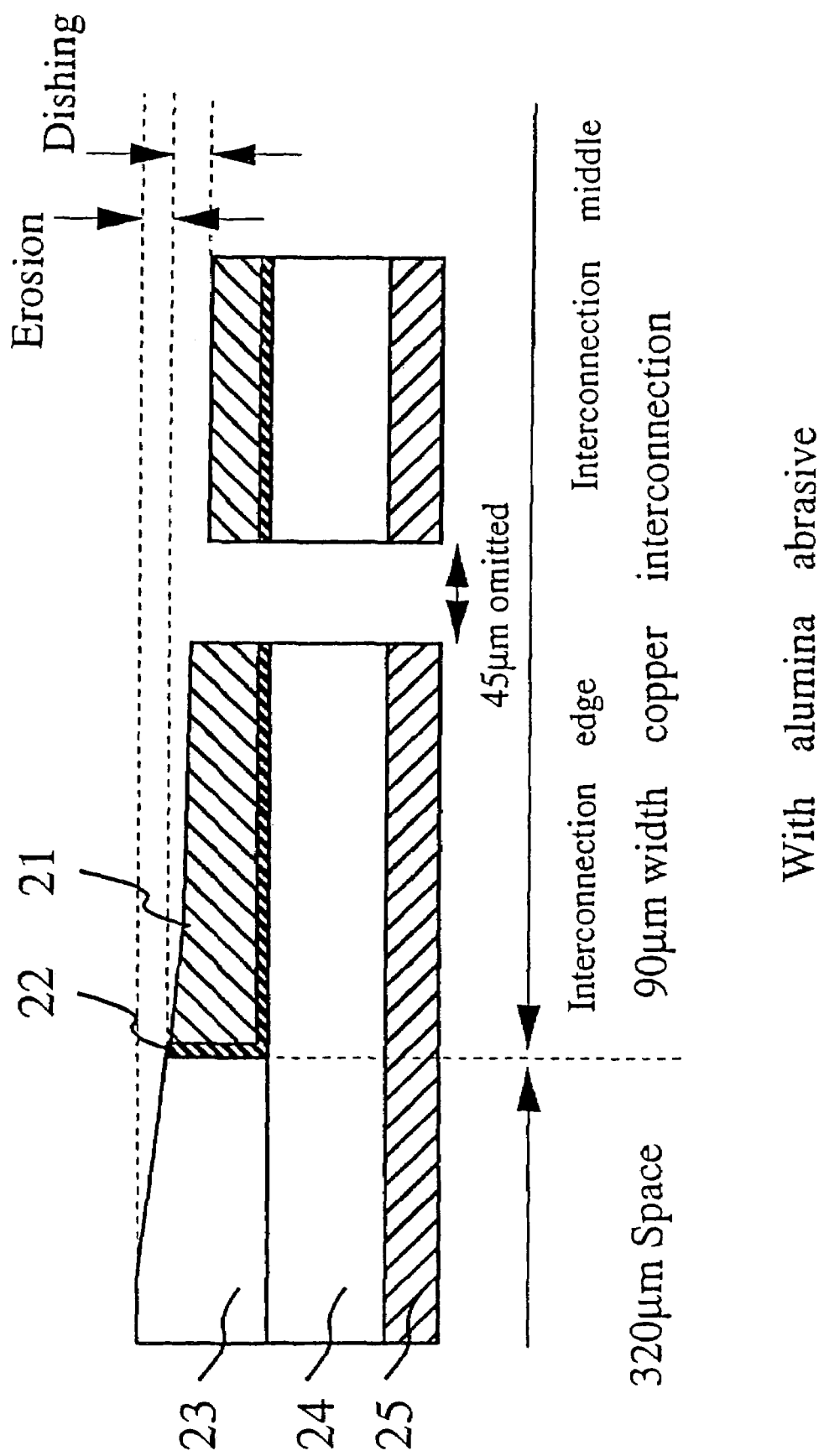

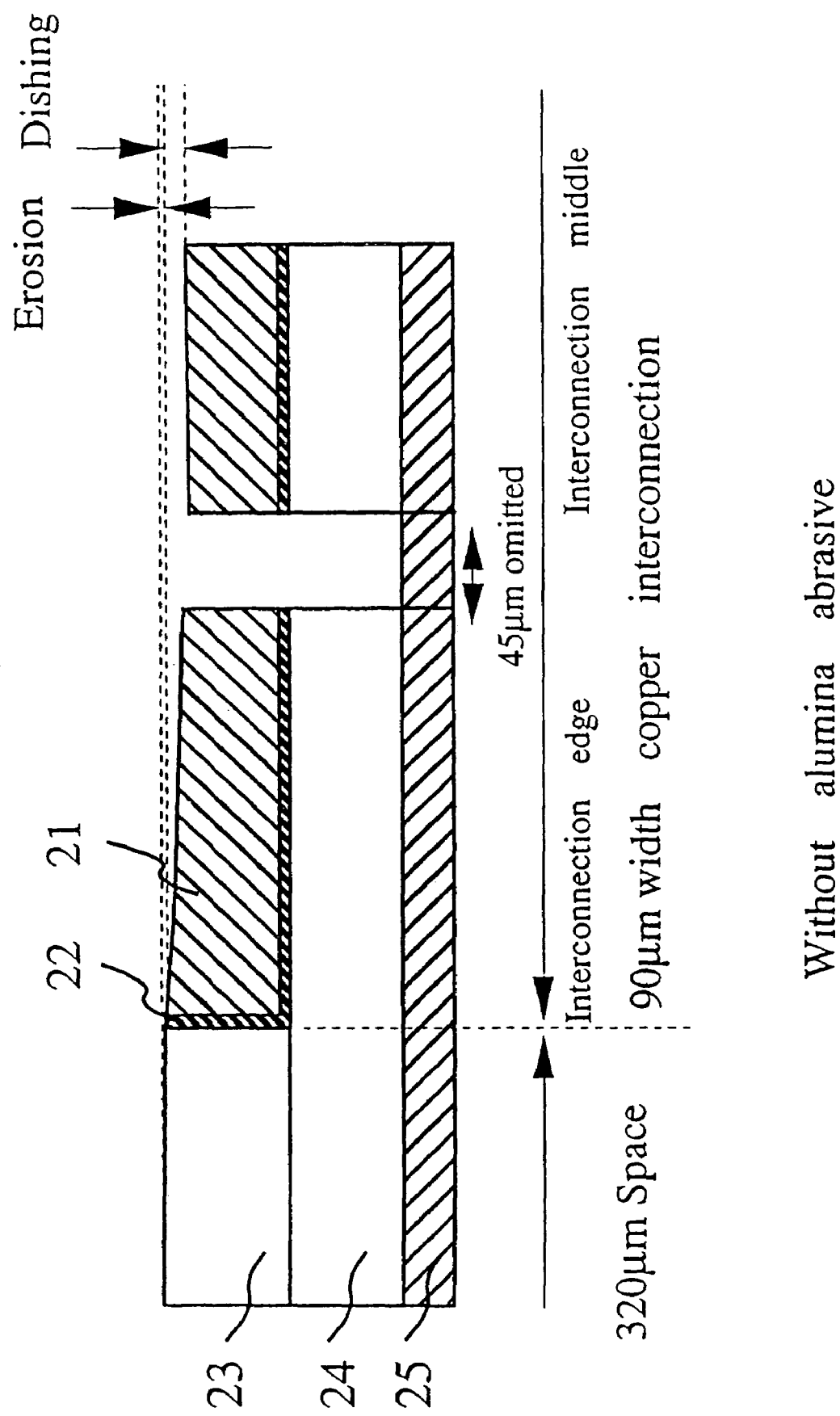

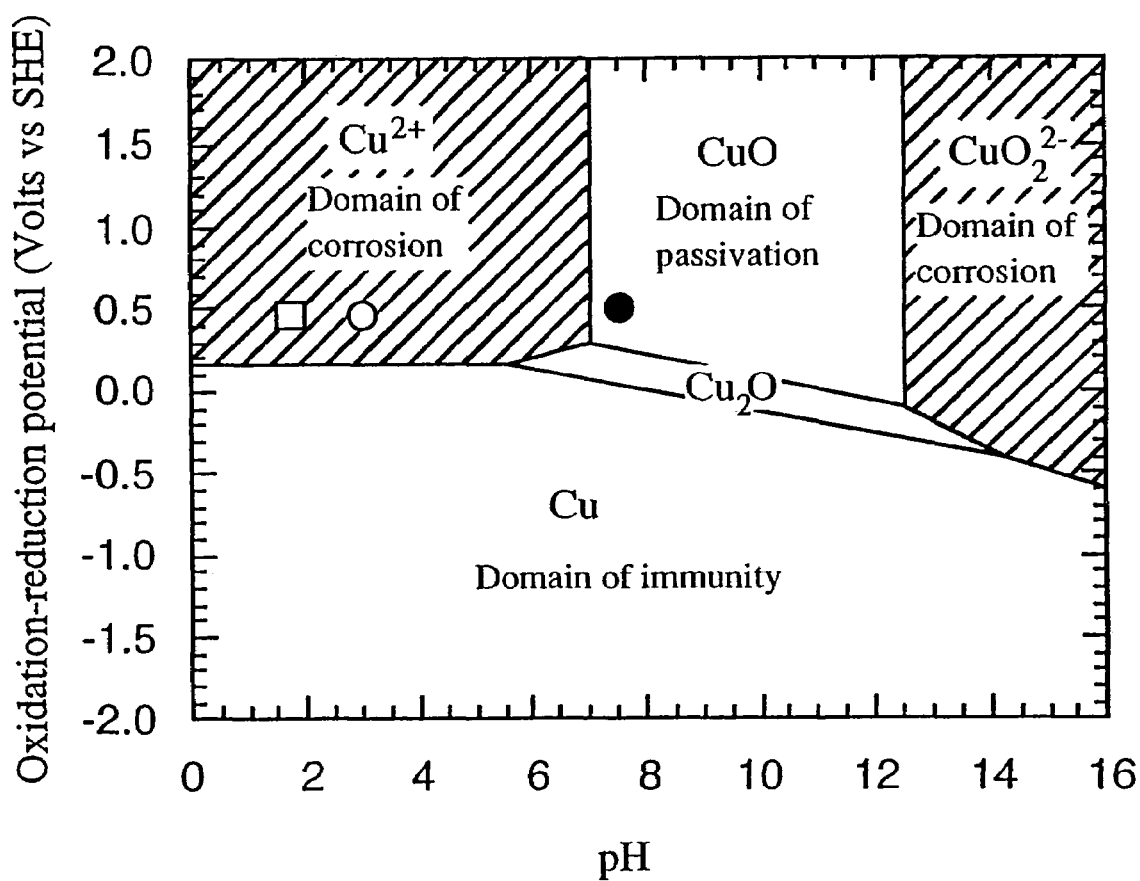

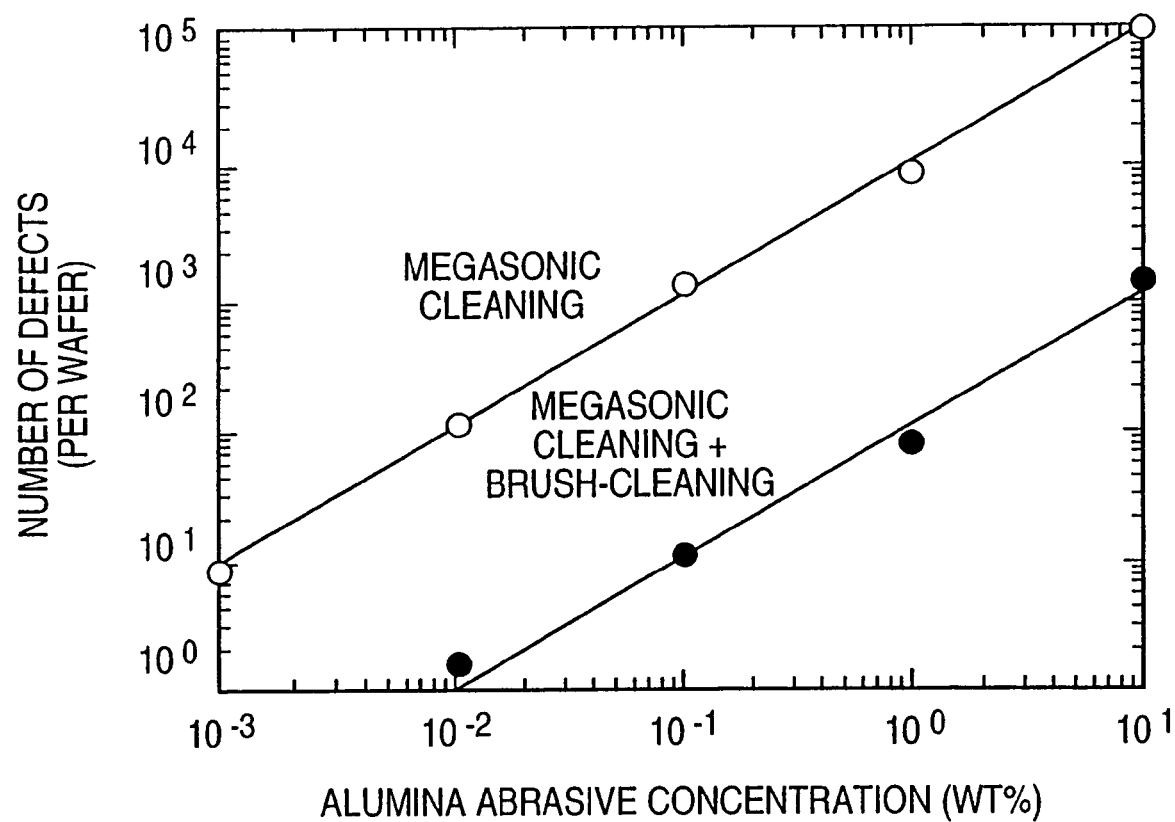

FIG. 11

| | MACHINE | PROCESS | OBJECT | TIME |
|---|---|---|---|---|
| | CMP MACHINE | CONDITIONING | PREVENTION OF CLOGGING OF POLISHING PAD BY ABRASIVE | 1 MIN |
| | | FIRST CMP | METAL CMP; FORMING OF INTERCONNECTION | 5 MIN |
| | | SECOND CMP | INSULATING FILM CMP; REMOVAL OF ABRASIVE AND REMOVAL OF DAMAGED LAYER ON INSULATING FILM | 1 MIN |
| | CLEANING MACHINE | FIRST BRUSH-CLEANING (NH4OH) | REMOVAL OF ABRASIVE | 1 MIN |
| | | SECOND BRUSH-CLEANING (HF) | REMOVAL OF METAL CONTAMINATION IN DAMAGED LAYER ON INSULATING FILM SURFACE | 1 MIN |
| | | MEGASONIC CLEANING | REMOVAL OF CLEANING SOLUTION | 30 SEC |
| | | SPIN DRYING | DRYING OF WATER | 30 SEC |

FIG. 12
| | MACHINE | PROCESS | OBJECT | TIME |
|---|---|---|---|---|
| 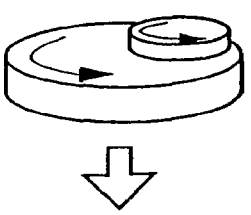 | CMP MACHINE | CMP | METAL CMP; FORMING OF INTERCONNECTION | 5 MIN |
| 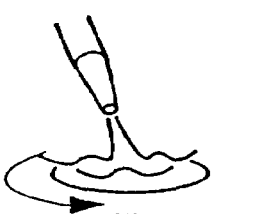 | CLEANING MACHINE | MEGASONIC CLEANING | REMOVAL OF CLEANING SOLUTION | 30 SEC |
| 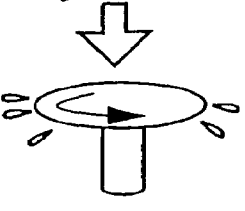 | | SPIN DRYING | DRYING OF WAFER | 30 SEC |

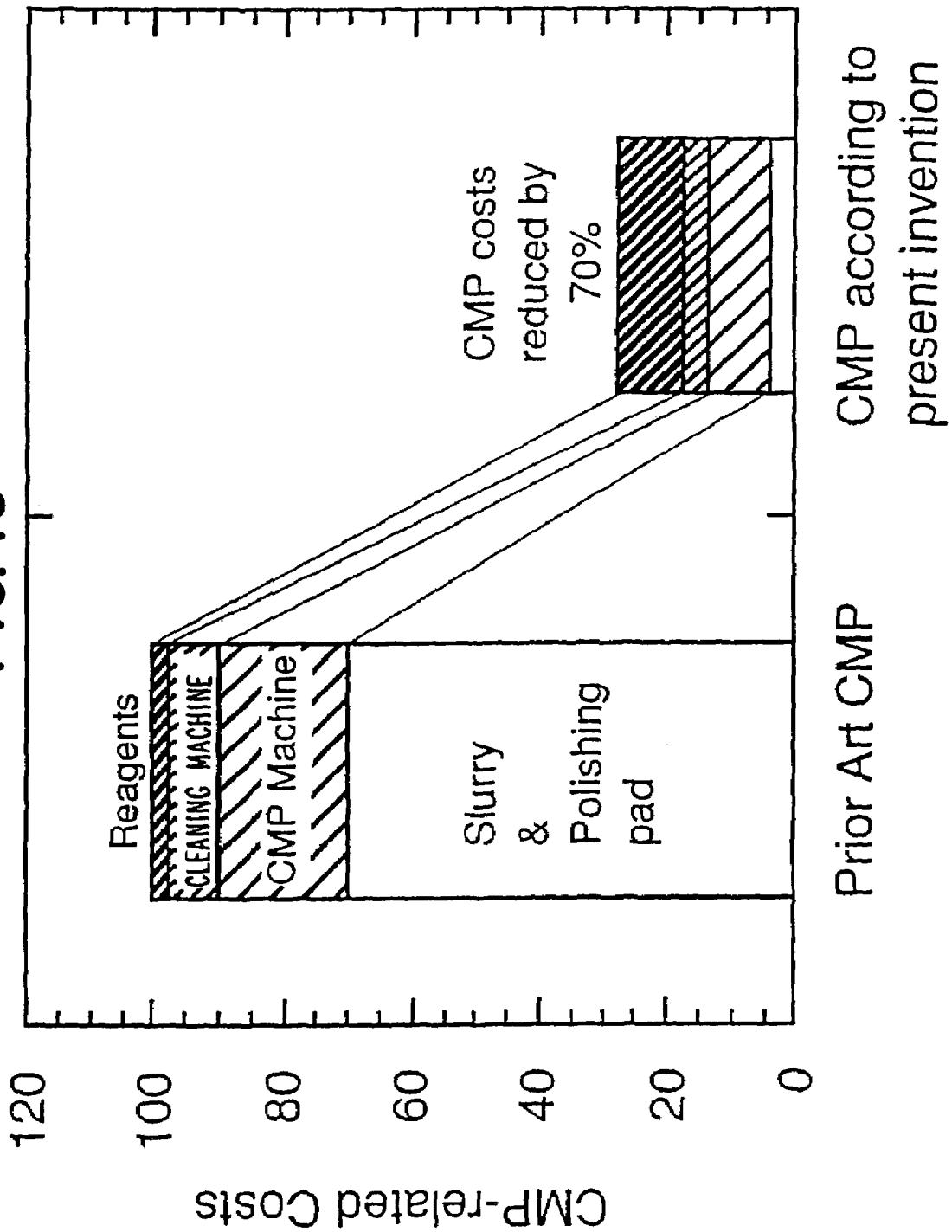

POLISHING METHOD

This application is a Continuation application of application Ser. No. 10/441,063, filed May 20, 2003, now U.S. Pat. No. 7,132,367, issued Nov. 7, 2006, which is a Continuation application of application Ser. No. 09/618,999, filed Jul. 18, 2000, now U.S. Pat. No. 6,596,638, issued Jul. 22, 2003, which is a Continuation application of application Ser. No. 09/182,438, filed Oct. 30, 1998, now U.S. Pat. No. 6,117,775, issued Sep. 12, 2000. The contents of application Ser. No. 09/182,438 are incorporated herein by reference in their entirety.

BACKGROUND OF THE INVENTION

1. Field of the Invention

This invention relates to polishing of a metal film, and in particular to a method of polishing a metal film in a semiconductor device interconnection process.

2. Description of Related Art

In recent years, as semiconductor integrated circuits (referred to hereafter as LSI) become more complex, new microtechniques are being developed. One of these is chemical mechanical polishing (referred to hereafter as CMP), which is often used in LSI manufacture, in particular flattening of interlayer insulating films, forming metal plugs and inlay of interconnections in multi-layer interconnection processes.

This technology is disclosed, for example, in U.S. Pat. No. 4,944,836.

To achieve higher speeds of LSI, attempts are being made to use low resistance copper alloy instead of the conventional aluminum alloys as an interconnection material, however with copper alloy, microprocessing by dry etching which was used with aluminum alloy is difficult. Therefore the "damascene" method is mainly employed, wherein an inlaid interconnection is formed by depositing a copper alloy thin film on an insulating film on which a groove is formed by dry etching, and the copper alloy thin film is removed by CMP excepting for the part inlaid in the groove. This technique is disclosed for example in Japanese Published Unexamined Patent Application No. 2-278822.

In general, slurries used for CMP of a copper alloy interconnection comprise a solid abrasive and oxidizing substance as the main components. The basic mechanism of CMP is to mechanically remove the oxide by a solid abrasive while oxidizing the surface of the metal by the oxidizing action of an oxidizing substance. This is disclosed on p. 299 of "The Science of CMP", edited by Masahiro Kashiwagi and published by Science Forum on Aug. 20, 1997 (in Japanese).

As solid abrasives, an alumina abrasive and silica abrasive are known with a particle diameter of a several 10-several 100 nm, but most solid abrasives for metal polishing on the market are of the alumina type.

Generally, as oxidizing substances, hydrogen peroxide ($H_2O_2$), ferric nitrate ($Fe(NO_3)_3$) and potassium iodate ($KIO_3$) are used, and these are described on p. 299-p. 300 of the aforementioned "Science of CMP".

However, when interconnections and plugs were formed by CMP using a conventional slurry containing a solid abrasive for metal film polishing as a main component, the following problems (1)-(8) occurred.

(1) Denting (referred to hereafter as dishing) occurs wherein the surface of the central part of the metal interconnection inlaid in the groove formed in the insulating film is polished excessively compared to the periphery, or a phenomenon (referred to hereafter as erosion) occurs wherein the insulating film surface around the interconnection is polished (FIGS. 5A, 5B).

The metal/insulating film selective ratio of a slurry intended for metal film polishing is as high as ten or more. This value is obtained by performing CMP on a wafer with only a flat metal film, and a wafer with only a flat insulating film, and comparing the polishing rates in the two cases.

However, it is known that when CMP is applied to a wafer where a metal film is deposited on an insulating film having a groove which is an interconnection pattern, excessive polishing occurs locally. This is due to the fact that there is unevenness on the surface of the metal film before CMP is performed, reflecting the groove which is the interconnection pattern. When CMP is applied, high pressure occurs locally according to the pattern density, and the polishing rate at these points is faster.

Therefore dishing and erosion become conspicuous problems in pads of large area (area of about 0.1 mm side) or with crowded interconnection patterns. These problems are mentioned in J. Electrochem. Soc., p. 2842-2848, Vol. 141, No. 10, October 1994.

(2) Scratches (polishing marks) occur due to the solid abrasive used for polishing. In particular, alumina which is the main material used as a metal polishing abrasive, has a greater hardness than silicon dioxide which is the main material of the insulating film. Therefore, scratches occur on the surface of an insulating film exposed by CMP in addition to the surface of the metal film used for the interconnection. Slurry remains behind in the scratches on the insulating film surface, and causes malfunction of the semiconductor device due to heavy metal ion contamination. It also affects the shape of the upper layer interconnection, and causes short circuits. The scratches on the metal film surface cause poor continuity and deterioration of electromigration resistance.

In order to prevent scratches, down force and platen rotation speed are reduced when CMP is employed. However, it is difficult for even this method to prevent scratches in a soft metal such as copper.

The scratches can be reduced by using a soft polishing pad, but dishing and erosion become more serious, and flatness after CMP deteriorates. It was therefore suggested to perform CMP with a hard polishing pad in a first stage, and then to finish with a soft polishing pad, i.e. to perform a two-stage CMP. A new problem however arises in this case that the throughput falls.

(3) Due to the high frictional force between polishing abrasive and the metal film surface when CMP is performed, peeling occurs between the metal film and the lower insulation layer, or between the spin-on-glass (referred to hereafter as SOG) in the lower insulating layer and the chemical vapor deposition (referred to hereafter as CVD) oxide film. To prevent peeling, the down force and platen rotation speed may be reduced, but if it is attempted to completely prevent it, the CMP rate falls and polishing time becomes longer which is not practical. This can be resolved by using a soft polishing pad, but dishing and erosion become serious, and flatness after CMP deteriorates.

(4) As a large amount of polishing abrasive remains behind on the wafer surface after CMP, cleaning must be performed before applying the next step, and foreign matter must be removed until it is below a specified level (e.g., there must be no more than 100 particles of foreign matter greater than 0.2 μm in one wafer). A cleaning machine which employs mechanical cleaning together with chemical cleaning is needed for this purpose.

The cleaning technique is very complicated as shown in FIG. 11. Brush-cleaning and megasonic cleaning that use a reagent fluid together are mainly performed. The brush materials must be special materials which do not damage the metal film surface, and for example, ammonium hydroxide or an aqueous solution of hydrofluoric acid are used as reagent fluid.

Megasonic cleaning is a cleaning method using a high frequency of 800 kHz applied to the cleaning fluid so as to remove abrasive from the substrate. This cleaning is more powerful than conventional cleaning by ultrasonic waves (40 kHz). In this technique, sufficient energy or force must be supplied to remove the abrasive from the substrate. On the other hand the output must be set in a range that does not damage the metal film and insulating film. An example of post-CMP cleaning is disclosed on p. 172 of the May 1995 edition of Semiconductor World (in Japanese).

(5) Consumable items used for CMP are costly. This is because the production cost of abrasives used in the slurry is high, and great care must be taken to adjust particle size. In particular, alumina abrasive is several times higher in price compared with silica abrasive.

In general, foaming polyurethane is used as a polishing pad. When CMP is performed, polishing abrasive adheres to this polishing pad, clogging occurs, and the CMP rate drops.

To prevent this, the polishing pad surface needed to be sharpened with a whetstone (referred to hereafter as a conditioner) to which diamond particles were made to adhere. Therefore the life of the polishing pad was short, and it was a high cost consumable item second to the polishing abrasive. The cost of the CMP process is discussed in "Recent Trends and Problems in CMP Apparatus and Related Materials", Realize Inc., New Tech Lecture, May 1996.

(6) Regarding CMP-related machines and equipment, in addition to the above-mentioned CMP machine and post-cleaning machine, a slurry feeder and processor of waste fluid containing slurry are required. Therefore, the cost of the whole CMP facility became very high. A stirrer is also needed to prevent sedimentation of abrasive in the slurry feeder, and an equipment was required to keep slurry circulating through the piping and stop it depositing. The cost of waste fluid processing is also high, and a recycling technique is needed.

(7) It is also a problem that the throughput of the whole CMP process is low. In a CMP facility, it is usual to condition the polishing pad, perform a first CMP to polish the metal film, and perform a second CMP (buff polishing) to remove the damaged layer of insulating film exposed by the first CMP. As the post-cleaning machine involves brush cleaning, wafers are usually cleaned wafer by wafer. Therefore, the throughput of the whole CMP process is the lowest in the semiconductor device manufacturing process. An example of the overall CMP process is given in detail, for example, in the May 1995 edition of Semiconductor World, p. 172.

(8) Although the CMP machine uses large amounts of polishing abrasive which generate dust, it must be operated in a clean room. A system must be provided to suppress dust in the exhaust duct of the CMP machine, and a special room must be set up in the clean room to maintain the degree of cleanliness, which is costly.

All the above problems are caused by performing CMP using a slurry containing a highly concentrated polishing abrasive. However, in one prior art CMP method, to increase the polishing rate, the surface of the metal is oxidized by an oxidizer, and the surface of metal that was exposed by mechanically removing this oxide layer with a polishing abrasive is re-oxidized. This process of oxide layer formation and mechanical removal is repeated. In other words, the polishing abrasive was necessary to provide a mechanical removal effect whereby the oxide film could be rapidly removed, and when polishing abrasive was not added, a practical CMP rate was not reached.

In Japanese Published Unexamined Patent Application No. 7-233485, a comparison example is given where CMP was performed with a polishing solution to which polishing abrasive was not added (0.1 wt % aminoacetic acid and 13 wt % hydrogen peroxide). It is reported that in this case, the polishing rate was 10 nm/min, about $\frac{1}{10}$ of that of a polishing solution to which an alumina polishing abrasive was added and about $\frac{2}{7}$ of that to which a silica polishing abrasive was added.

FIG. 2 is the result of an additional test based on said Japanese Published Unexamined Patent Application No. 7-233485. This measured the hydrogen peroxide aqueous concentration dependency of CMP rate and etching rate in a polishing solution containing 0.1 wt % aminoacetic acid and hydrogen peroxide (not containing abrasive), so as to reproduce the results of the aforesaid Koho. It should be noted that FIG. 2 shows a concentration of 30% aqueous hydrogen peroxide, and to make a comparison with the above Koho, the results should be multiplied by a factor of 0.3. The hard pad IC1000 of the Rodel company was used as a polishing pad. The rotation speeds of the platen (diameter: 340 mm) and holder were both 60 rpm, and the down force was 220 g/cm$^2$ (same as CMP condition of this invention). From the result of FIG. 2, it is seen that when an abrasive is not included, the CMP rate is barely 20 nm/min, i.e. a practical CMP rate is not obtained. When the hydrogen peroxide concentration is low, the etching rate is fast, and stability of polishing becomes poor. The stability rises if the hydrogen peroxide concentration is increased, but the CMP rate becomes very low which is disadvantageous from the viewpoint of throughput.

On further examination, it was also found that the still solution etching rate (the etching rate in the case when a stationary sample was immersed in a polishing solution which was not stirred) does not fall exactly to zero even at high hydrogen peroxide concentration. When the polishing solution is stirred, and the etching rate is measured (the etching rate in a stirred solution is near to the etching rate during CMP), it is seen that the etching rate increases, and exceeds ½ of the polishing rate.

Therefore, it was found that unless the CMP rate was increased by including an abrasive and the ratio of the CMP rate and stirred etching rate (referred to hereafter as rate ratio) was increased, the solution could not be used as a polishing solution. When the rate ratio is low, etching proceeds in depressions not in contact with the polishing surface, and flatness is lost. In fact, using a polishing solution wherein the hydrogen peroxide solution concentration was varied, it was found that a polishing time of from 40 minutes to 1 hour 30 minutes was needed.

A cross-section of the copper interconnection formed is shown in FIGS. 22A, 22B. Most of the copper which would have been left in the groove of the silicon dioxide film was etched out. As a result of a continuity test using a meandering pattern (line width 0.3-3 µm, length 40 mm), the yield was 0%. Therefore, this could not be used as an LSI interconnection. This is due to the fact that as the CMP rate is slow, etching occurred during the long polishing time.

If the concentration of aminoacetic acid is raised, the CMP rate increases, but the stirred etching rate also increases and the same result is obtained. It was found that to suppress etching, potassium hydroxide may be added to the polishing solution to adjust the alkalinity to pH10.5. However, a problem occurs in that the selective ratio falls and erosion occurs due to the etching of the silicon dioxide film by potassium hydroxide. Potassium ion which remains behind spreads through the insulating film, and causes deterioration of the characteristics of the semiconductor device.

This problem is due to the fact that aminoacetic acid itself has not much ability to make copper oxide water-soluble. As seen from the pH-oxidation/reduction potential diagram on p. 387 in M. Pourbaix, "Atlas of Electrochemical Equilibria in Aqueous Solutions", 1975, published by NACE, and shown in FIG. 9, the range in which copper is made water-soluble as copper ion (domain of corrosion) is pH7 and below, and as aminoacetic acid is neutral, its effect is weak.

FIG. 26 shows the difference of corrosion rate (etching rate) in the domain of corrosion and domain of passivation of copper. The solid line shows the corrosion rate when the oxidation-reduction potential is the same for the citric acid-based polishing solution and the aminoacetic acid-based polishing solution in FIG. 9. As typical examples, corrosion rate was plotted for a polishing solution comprising a mixture of citric acid and aqueous hydrogen peroxide in the domain of corrosion, and a polishing solution comprising a mixture of aminoacetic acid and aqueous hydrogen peroxide in the domain of passivation. Both polishing solutions were prepared with equal mole ratios. Hence, in the domain of corrosion, copper is rendered water-soluble and ionized at a much faster rate than in the domain of passivation.

This is mentioned in Proceedings of the CMP-MIC Conference, 1996, p. 123. Actually, it is reported that aminoacetic acid has no ability to etch copper oxide, but if copper oxide cannot be made water-soluble, it remains on the insulating film which is exposed after performing CMP, and causes electrical short circuits between interconnections. If the slurry contains an abrasive, the copper oxide is easily removed by mechanical action.

Conventional metal etching solutions lie within the above-mentioned domain of corrosion, but it is not certain that they can all be used as CMP polishing solutions for LSI multi-layer interconnections. This is because a slow etching rate is suitable for CMP polishing solutions. This is described, for example, in relation to abrasion experiments on copper surfaces using an aqueous solution of nitric acid, Journal of Abrasive Polishing, p. 231-233, Vol 41, No. 1, 1997 (in Japanese). It is reported that when there is no abrasive, the CMP rate is low, but due to the absence of scratches, the solution is suitable as a polishing solution. However, the etching rate of this polishing solution was not studied, and there was no attempt to form an interconnection structure. As a result of performing additional tests on this polishing solution, it was found that the still solution etching rate of copper using 1 vol % aqueous nitric acid is 50 nm/min, but a sufficiently large ratio could not be obtained for the CMP rate of 80 nm/min mentioned in the aforesaid Journal. Further, when CMP was applied to form an inlaid interconnection, the copper in the part which should have formed the interconnection was etched and almost completely lost. Hence, polishing can be performed with a polishing solution wherein the etching rate is not suppressed, but an inlaid interconnection cannot be formed.

SUMMARY OF THE INVENTION

This invention, which was conceived in view of the aforesaid problems, therefore aims to provide a polishing method and semiconductor manufacturing method which permit at least one of the following to be attained: (1) control of dishing and erosion in the formation of an inlaid interconnection, (2) reduction of scratches, (3) reduction of peeling, (4) simplification of post-CMP cleaning, (5) cost reduction of polishing solutions and polishing pads, (6) simplification of slurry supply/processing equipment, (7) higher throughput, and (8) less dust.

The above objects are attained by a metal film polishing method wherein a metal film surface is mechanically rubbed using a polishing solution not comprising a polishing abrasive or comprising a polishing abrasive at a low concentration of less than 1 wt %, and having a pH and oxidation-reduction potential within the domain of corrosion of the metal film. A substance for suppressing corrosion (an inhibitor) may be added to the polishing solution as necessary.

The above objects are achieved by mechanically rubbing the metal film surface with a polishing solution 1 comprising an oxidizer (substance which removes metal electrons and raises the atomic valence) and a substance which renders oxides water-soluble. In this case, it may be applied to a metal film of Cu, W, Ti, TiN or Al.

The above objects are achieved by mechanically rubbing the metal film surface with a polishing solution 2 comprising a substance which renders the aforesaid metal water-soluble. In this case, it may be applied to metal films of Al or the like, which are commonly metals having a lower ionization tendency than hydrogen. Examples of substances which render the metal water-soluble are hydrochloric acid, organic acids, or alkalis such as ammonium hydroxide. The above objects are also achieved by using ammonium hydroxide as the substance which renders the metal water-soluble in the case of copper, which has a higher ionization tendency than hydrogen.

As the pH and oxidation-reduction potential of the above polishing solution are within the domain of corrosion of the metal, the metal can be rendered water-soluble, and metal remaining on the surface of the insulating film exposed on the surface of the polished substrate can be reduced. The domain of corrosion of each metal is given in the pH-oxidation/reduction potential diagram of Pourbaix mentioned above. For example, in the case of copper, Cu dissolves as $Cu^{2+}$ ion if pH<7 and the oxidation reduction potential >0.2, as shown in FIG. 9. Otherwise, it dissolves as $CuO_2^{2-}$ ion in the alkaline region of pH>12.5. Therefore, when polishing copper, it is desirable that it is in either domain of corrosion.

The Pourbaix diagram relates to an $H_2O$ system, and when other reagents are contained in the polishing solution, the range of the domain of corrosion in the pH and oxidation-reduction potential diagram will vary. The domain of corrosion in the context of this invention is defined by whether or not certain substances, including these substances, are within the range of pH and oxidation-reduction potential in which the polishing solution corrodes the metal. When the polishing solution contains both a corrosive substance and an inhibitor, the former is within the domain of corrosion shown by this invention.

When CMP is performed with the polishing solution 1 containing the aforesaid substance, the metal surface is first oxidized by the oxidizer, and a thin oxide layer is formed on the surface. Next, when a substance is supplied to make the oxide water-soluble, the oxide layer becomes an aqueous solution, and the thickness of the oxide layer decreases. The part of the oxide layer which became thinner is again exposed to the oxidizer, and the thickness of the oxide layer increases. This reaction is repeated as CMP progresses. As projections 50 on the metal surface shown in FIG. 4A are constantly being mechanically rubbed by the polishing pad, reaction products on the surface are easily removed, the reaction is promoted due to local heating, the above oxidation/water-solubilization cycle is repeated, and the reaction progresses more rapidly than in depressions 49. Therefore, the polishing rate of the projections 50 is accelerated and they are flattened.

The inhibitor adheres to the metal surface, suppresses the reaction of the depressions and has the final effect of improving flatness. If the polishing solution is within the domain of corrosion of the Pourbaix diagram even when an inhibitor is added, the aforesaid reaction proceeds at the projections on the metal surface where the inhibitor has been removed by rubbing with the polishing pad, and the surface becomes flat. In other words the polishing solution has both a corrosive effect and an inhibitory effect, and it is important to control both effects during CMP. The addition concentration of the inhibitor to the polishing solution should be such that inhibitor adhering to the projections on the metal surface is removed by the mechanical friction of the polishing pad. As a guide for this addition concentration, it is desirable that the CMP rate is maintained at 50 nm/min or more, and that the stirred etching rate should be several nm/min or less (rate ratio of the order of 50). When the inhibitor is added in greater concentration, the CMP rate may fall. If the CMP rate is sufficiently high without the addition of additives, and the etching rate is no greater than several nm/min, the substrate can be polished to a high degree of flatness even if the inhibitor is not added.

In the prior art CMP method, the metal surface was oxidized by an oxidizer, and the CMP rate was increased by mechanically removing this oxide layer using a polishing abrasive. According to this invention however, although the concentration of polishing abrasive is reduced, a practical CMP rate is effectively obtained by the mechanical friction of the polishing pad alone by adding a substance which renders the oxide water-soluble.

The above-mentioned objectives (1)-(8) are achieved by the following polishing abrasive concentration ranges.
(1) The object of suppressing dishing and erosion is achieved by making the concentration of the above-mentioned polishing abrasive equal to or less than 0.05 wt %.
(2) The object of reducing scratches on the insulating film surface is achieved by making the concentration of the above-mentioned polishing abrasive less than 1 wt %.
(2) The object of reducing scratches on the metal film surface is achieved by making the concentration of the above-mentioned polishing abrasive equal to or less than 0.1 wt %.
(3) The object of reducing peeling is achieved by making the concentration of the above-mentioned polishing abrasive equal to or less than 0.5 wt %.
(4) The object of improving cleaning performance is achieved by making the concentration of the above-mentioned polishing abrasive equal to or less than 0.01 wt %.
(5) The object of reducing the cost of the polishing solution and polishing pad is achieved by making the concentration of the above-mentioned polishing abrasive equal to or less than 0.001 wt %.
(6) The object of resolving problems of slurry supply and processing equipment is achieved by making the concentration of the above-mentioned polishing abrasive equal to or less than 0.0001 wt %.
(7) The object of improving throughput is achieved by making the concentration of the above-mentioned polishing abrasive equal to or less than 0.01 wt %.
(8) The object of suppressing dust is achieved by not adding the above-mentioned polishing abrasive.

As hydrogen peroxide does not contain metal components and is not a strong acid, it is the most desirable oxidizer. Ferric nitrate and potassium iodate contain a metal component, but they have the effect, of increasing the CMP rate due to their strong oxidizing power.

Examples of substances that make the afore said oxide water-soluble are acids, which convert the metal to metal ion (e.g. $Cu^{2+}$ ion). Typical inorganic acids are nitric acid, sulfuric acid and hydrochloric acid.

Organic acids or their salts have low toxicity and are easy to or handle as a polishing solution. Typical examples are hydroxy acid and carboxylic acid such as citric acid, malic acid, malonic acid, succinic acid, phthalic acid, dihydroxysuccinic acid, lactic acid, maleic acid, fumaric acid, pimelic acid, adipic acid, glutaric acid, oxalic acid, salicylic acid, glycolic acid, benzoic acid, formic acid, acetic acid, propionic acid, butyric acid and valeric acid and their salts. Salts increase solubility, and preferably comprise ammonium salts, which do not contain a metal component, or an element which does not have an adverse effect on semiconductor elements (e.g. aluminum).

Of the aforesaid acids, citric acid, malic acid, malonic acid, succinic acid, dihydroxysuccinic acid and formic acid are preferable as the acid used in the polishing solution of this invention due to high CMP rate and low etching rate.

Of the aforesaid acids, especially, citric acid and malic acid are generally used as food additives, and due to their low toxicity, low effluent problem, lack of odor and high solubility in water, they are preferable as the acid used in the polishing solution of this invention.

Due to its low solubility in water, it is preferable to use the salt of phthalic acid, but even if the pH changes when it is used as a salt, it is necessary to maintain the polishing solution in the domain of corrosion of the metal.

For example when phthalic acid is used as a polishing solution for copper, if the hydrogenphthalate salt is used wherein only one of the two carboxyl groups in the phthalic acid molecule is substituted, the solubility in water increases and the pH can be kept acid (domain of corrosion), so it is suitable as a polishing solution.

In a phthalic acid salt where two carboxyl groups are substituted, the polishing solution is almost neutral, and the CMP rate decreases. The same is true of other organic acids.

One substance alone may be used both as an oxidizer and as a reagent for rendering the oxide soluble, for example nitric acid which dissolves copper. This makes it possible to reduce the amount of reagent added, so the time and cost required to prepare the polishing solution can be reduced. Other oxidizers such as hydrogen peroxide can also be mixed in to increase oxidizing power.

Moreover, the substance which renders the oxide water-soluble may be ammonium hydroxide, ammonium nitrate or ammonium chloride.

As described above, when ammonium ion is contained in the polishing solution, the domain of corrosion changes, and copper is dissolved as $Cu(NH_3)^{2+}$ ion even at pH>4.5. The pH-oxidation-reduction potential diagram for the Cu—NH₃—H₂O system is described in, for example, J. Electrochem. Soc., p. 2381, Vol. 142, No. 7, July 1995.

Examples of substances which suppress etching or oxidation are inhibitors and surfactants. This substance may be a material which, when mixed with the polishing solution, suppresses etching while permitting a sufficient CMP rate to be obtained. In particular, the most effective inhibitor for copper alloy is benzotriazole (referred to hereafter as BTA). Other substances with an inhibitory effect are tolyltriazole (referred to hereafter as TTA), BTA derivatives such as BTA carboxylic acids (referred to hereafter as BTA-COOH), cystine, haloacetic acids, glucose and dodecyl mercaptan.

The effective surfactants are polyacrylic acid, polyammoniumacrylate, polymethacrylic acid, polyammoniummethacrylate. The most effective surfactant is polyammoniumacrylate due to high CMP rate and low etching rate.

As a means of applying mechanical friction, a polishing pad may be used wherein more than 1 wt % of polishing abrasive is not supplied to the polishing solution.

The optimum hardness of the polishing pad is different depending on the object on which CMP is performed, but if for example a copper electrode pattern of 0.1 mm side is to be formed, and the permissible amount of dishing is 100 nm or less, it is desirable that when the polishing pad is pushed into a 0.1 mm opening under the load for performing CMP, the amount by which the polishing pad is compressed and pushed out from the opening is no more than 100 nm. A hard polishing pad meets this condition, and by using such a pad, dishing can be suppressed.

The damascene method is a technique wherein a metal film is formed on an insulating film which has an opening, polished, and the metal film is left in the opening.

However, when a plug of one µm or less is to be formed, a soft polishing pad can also be used. Preferably, the polishing pad is hard, provided that scratches or peeling is not caused, however it must be sufficiently soft to be able to follow projections on the substrate surface other than the interconnection or plug pattern, such as for example the curve of a wafer.

As in the case of the abrasive concentration of the polishing solution, the upper limit of polishing abrasive supplied from the polishing pad is different according to the above objects (1)-(8). For example, the object (1) of suppressing dishing and erosion is achieved by an abrasive concentration of 0.05 wt % or less.

A polishing solution having a CMP rate of 10 nm/min or less requires 80 min for performing CMP on a metal film of, for example, 800 nm. Therefore, it is not practical for preparing an interconnection structure, and as it does not resolve the above problems of throughput and cost; it is not defined as a polishing solution according to this invention.

It is preferable that the ratio of CMP rate and etching rate is 5 or more, and if possible, 10 or more. If it is less than this, the interconnection structure cannot be formed with high precision due to the etching effect produced in CMP even if the CMP rate is high. Preferably, the etching rate is no higher than several nm/min.

This invention is most effective for performing CMP on copper alloy or aluminum alloy wherein scratches, dishing and erosion may easily occur. It is also effective for reducing scratches on insulating films in other metal CMP, e.g. tungsten and tungsten alloy, and titanium and titanium alloy (particularly titanium nitride).

BRIEF DESCRIPTION OF THE DRAWINGS

These and other features, objects and advantages of the present invention will become apparent from the following description when taken in conjunction with the accompanying drawings wherein:

FIG. 6A is erosion amount and dishing amount of a sample on which CMP was performed according to the prior art method;

FIG. 6B is erosion amount and dishing amount of a sample on which CMP was performed according to the method of this invention;

FIG. 8A is a cross-sectional view of a sample on which CMP was performed according to the prior art method;

FIG. 8B is a cross-sectional view of a sample on which CMP was performed according to the method of this invention;

FIG. 9 is a pH-oxidation/reduction potential diagram for copper;

FIG. 10 is a diagram showing the dependence of number of defects in a wafer on alumina abrasive concentration in a polishing solution;

FIG. 11 is a schematic diagram showing the prior art CMP process;

FIG. 12 is a schematic diagram showing the CMP process of this invention;

FIG. 13 is a diagram showing the CMP-related cost reduction effect of this invention;

DETAILED DESCRIPTION OF THE PREFERRED EMBODIMENTS

This invention will now be described in detail with reference to the drawings.

Embodiment 1

A method of forming a copper interconnection by performing CMP on according to this embodiment will be described.

Figure 1:
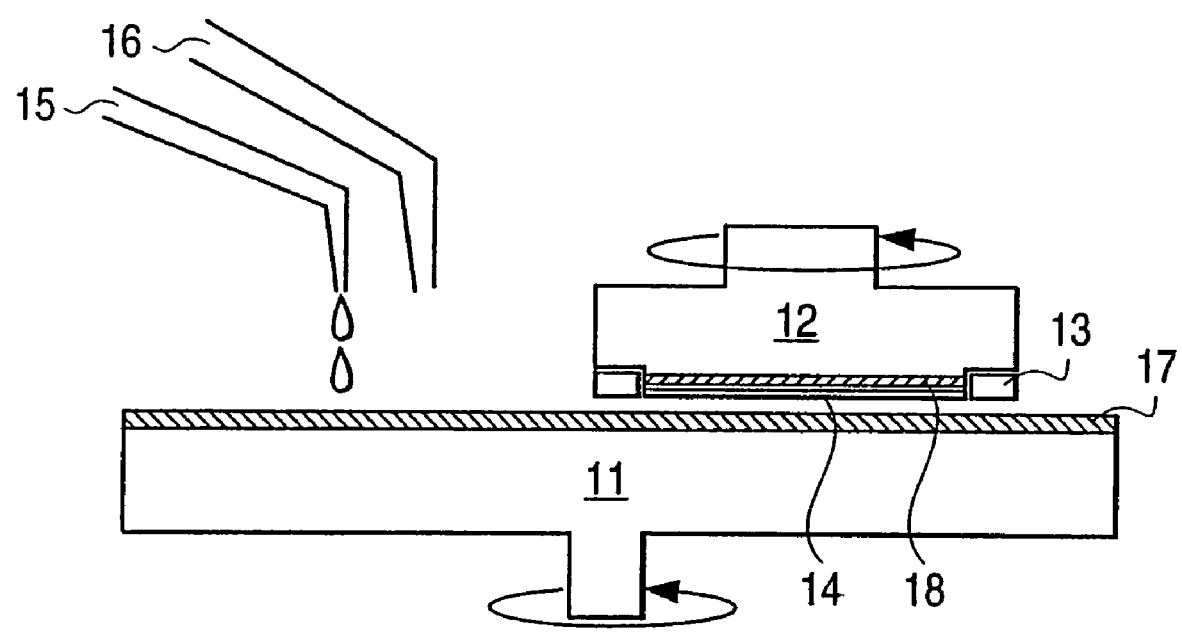
FIG. 1 is a diagram showing a CMP machine implementing this invention.

FIG. 1 is a schematic view showing a CMP machine used in this embodiment of the invention.

To perform CMP, a holder 12 which supports a wafer 14 by a backing pad 18 is rotated on a platen 11 to which a polishing pad 17 is attached. A retainer ring 13 is provided so that the wafer does not come off during CMP. The down force in CMP was 220 g/cm$^2$, and the rotation speed of platen and holder was 60 rpm. However, the down force and rotation speed are not limited to this.

Figure 25:
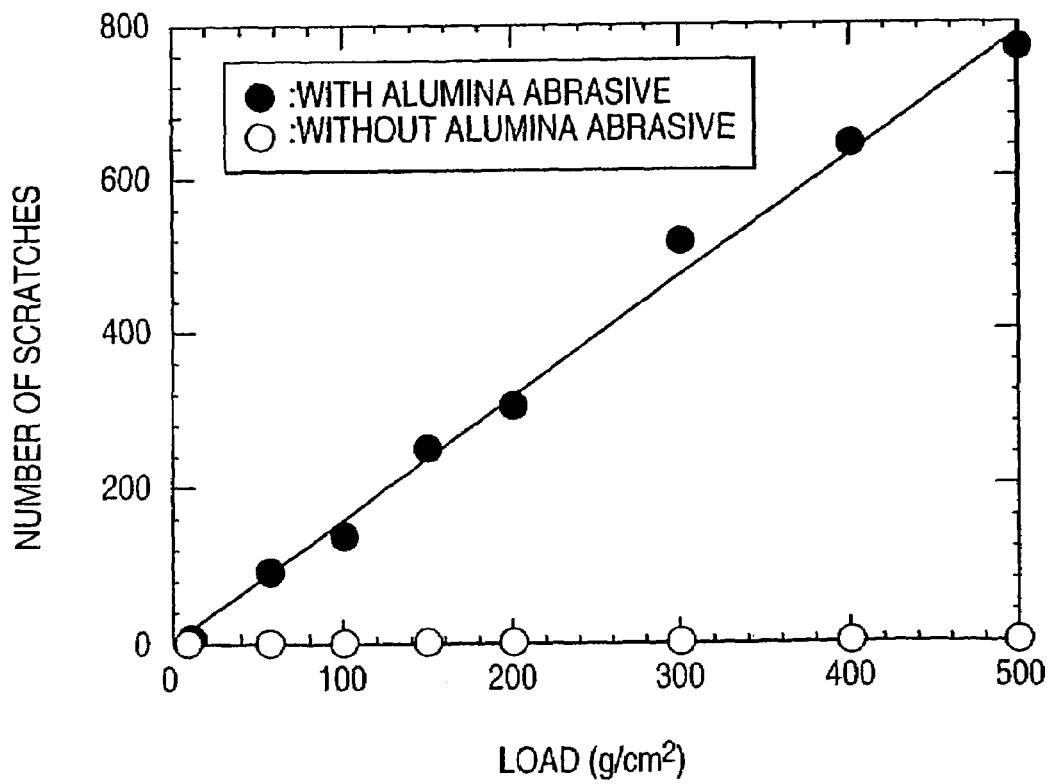
FIG. 25 is a diagram showing the dependence on down force of a number of scratches produced on a silicon dioxide film when CMP was performed using a polishing solution comprising an abrasive.
Figure 26:
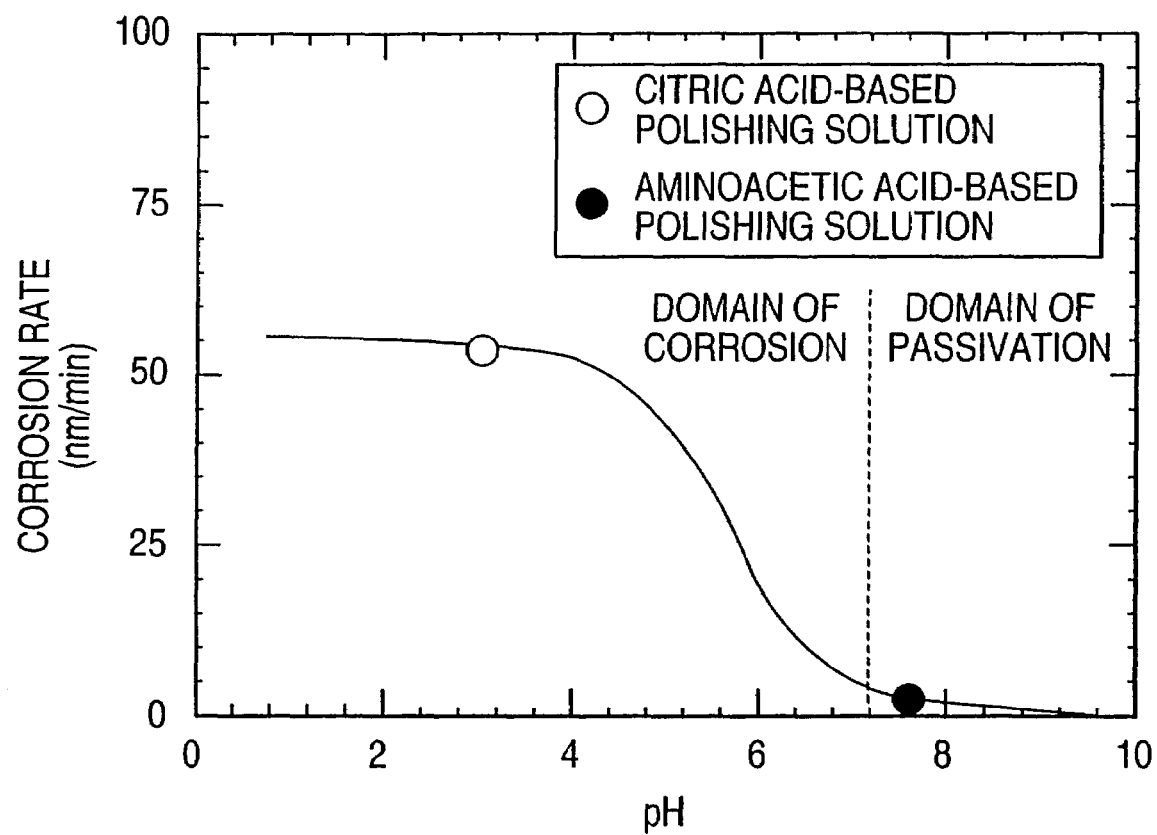
FIG. 26 is a diagram showing a difference of corrosion rate in the domain of corrosion and domain of passivation of copper.

In general, the CMP rate is faster if the load and rotation speed are increased, but scratches occur more easily as shown in FIG. 25. However, as the polishing abrasive concentration is low or zero in this invention, not many scratches occur relative to the load.

The polishing pad used was the polishing pad IC1000 manufactured by the Rodel company.

The polishing solution of this invention was dripped from a first supply nozzle 15 provided on the platen onto the polishing pad at a rate of about 30 cc/min, and CMP was performed. When CMP was finished, the first supply nozzle 15 was closed to stop supply of polishing solution, and pure water was supplied from a second supply nozzle 16 at a rate of approximately 3000 cc/min to perform rinsing for 15-30 seconds. Next, without drying the wafer, megasonic cleaning was performed to remove polishing solution, and the wafer was dried.

The basic polishing characteristics of the polishing solution were examined using a wafer on which an interconnection pattern had not been formed.

A sample was obtained by forming silicon dioxide to a thickness of 200 nm on a silicon wafer, and continuously depositing a TiN film of 50 nm thickness as adhesion layer and a Cu film of thickness 800 nm in vacuum by the sputtering method. The diameter of the wafer was 4 inches.

The polishing solution used in this embodiment was a mixture of an oxidizer and an organic acid, which is a substance for rendering oxide water-soluble. The oxidizer was hydrogen peroxide (30% aqueous solution of $H_2O_2$), and citric acid was used as the organic acid. Citric acid has the advantage of high solubility in water. To optimize the mixing ratio, the concentration was varied, and CMP rate and etching rate were examined. The temperature of the polishing solution was room temperature.

Figure 2:
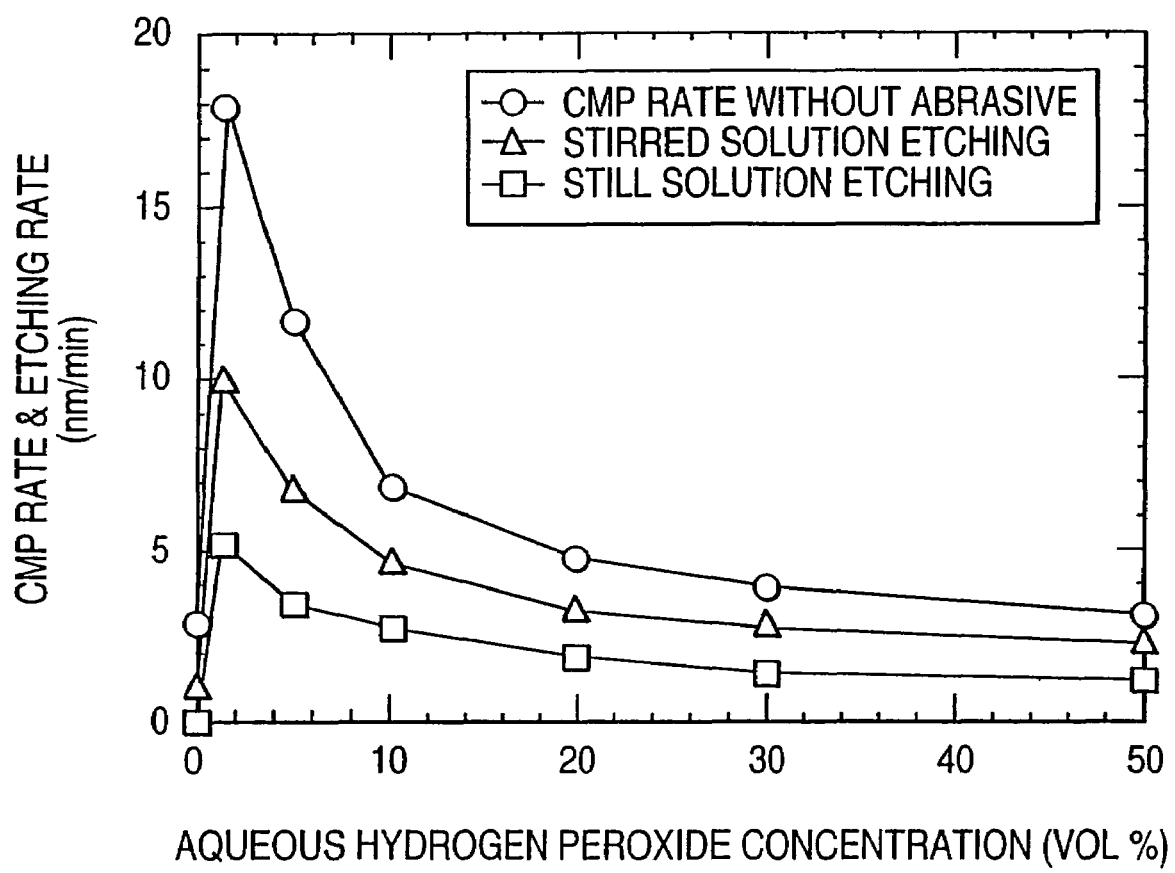
FIG. 2 is a diagram showing the hydrogen peroxide concentration dependence of CMP rate and etching rate of copper when CMP is performed according to the prior art method.

The etching rate is the etching rate of a copper surface when the sample was immersed in the polishing solution. As the interconnection structure cannot be formed when etching during CMP is excessive, the etching rate is preferably as low as possible. The still solution etching rate and stirred solution etching rate were examined as in FIG. 2. The CMP rate and the etching rate were estimated by converting from the electrical resistivity variation.

Figure 3:
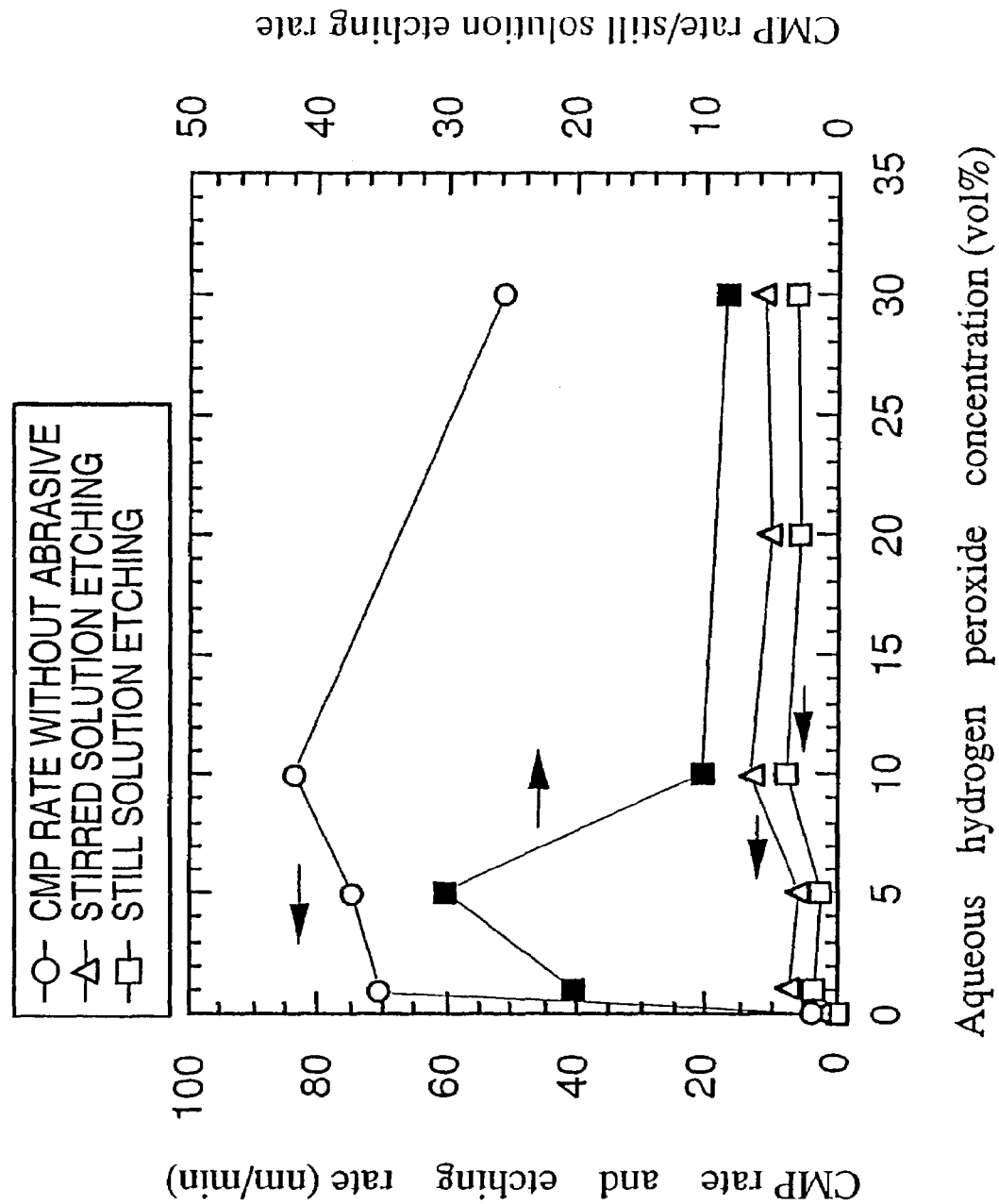
FIG. 3 is a diagram showing the hydrogen peroxide concentration dependence of CMP rate and etching rate of copper when CMP is performed according to the method of this invention.

FIG. 3 shows the result of examining the dependency of the polishing solution on aqueous hydrogen peroxide concentration. The citric acid concentration was 0.03 wt %. The ratio of the CMP rate to the still solution etching rate is also shown.

The CMP rate shows a maximum value of 84 nm/min when the aqueous hydrogen peroxide concentration is 10 vol %, but as the etching rate has a low value of 5 nm/min or less at 5 vol % or lower, the ratio of CMP rate and etching rate shows its highest value of 30 at 5 vol %. Using either hydrogen peroxide or citric acid alone, the CMP rate is 10 nm/min or less, which is not sufficient for the purpose of forming an inlaid interconnection. That is, the polishing solution must contain both citric acid and aqueous hydrogen peroxide.

A copper inlaid interconnection pattern was formed using a polishing solution comprising 5 vol % of aqueous hydrogen peroxide and 0.03 wt % citric acid mixed with pure water. This polishing solution is in the domain of corrosion of copper, as shown in FIG. 9.

Figure 4A:
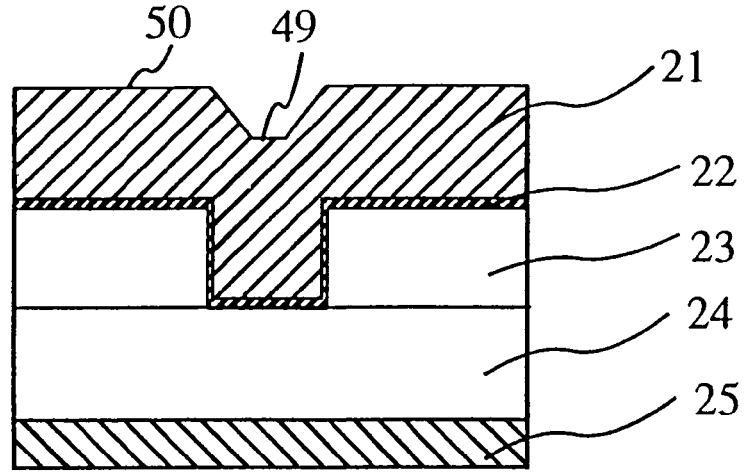
FIG. 4A is a diagram showing the cross-sectional structure of an interconnection part of a sample before CMP.

A cross-section of a sample with an inlaid interconnection before polishing is shown in FIG. 4A. A BPSG film 24 (silicon dioxide to which boron and phosphorus were added)

of thickness 500 nm and a silicon dioxide film 23 of thickness 500 nm were formed on a silicon substrate 25 on which an impurity-doped layer and insulating film had been formed, and an interconnection groove pattern of thickness 500 nm was formed in the silicon dioxide layer 23 by a lithography process and dry etching process. After forming a TiN layer 22 of thickness 50 nm as adhesion layer on the product, a copper film of thickness 800 nm was continuously formed in vacuum by sputtering. Vacuum heat processing was also performed at 450° C. for 30 min in the sputter machine to improve step covering properties. Impurity-doped layers such as a source and drain were thereby formed in the silicon substrate 25, but these will not be described here.

Figure 4B:
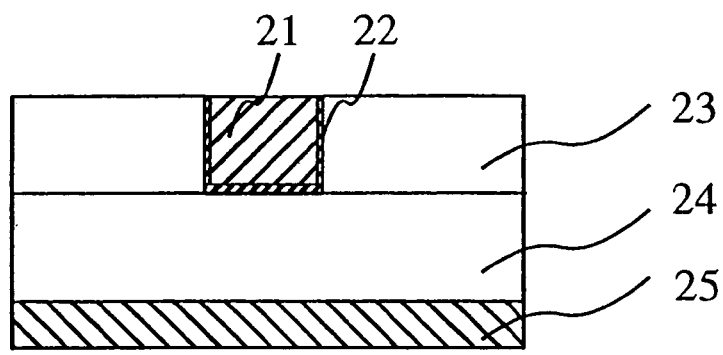
FIG. 4B is a diagram showing the cross-sectional structure of the interconnection part of the sample after CMP.

When CMP was performed using a polishing solution comprising a mixture of 5 vol % hydrogen peroxide and 0.03 wt % citric acid with pure water, this sample was formed into a shape having no more than 50 nm dishing and erosion as shown in FIG. 4B. When the electrical resistivity of the copper interconnection was measured, a value of 1.9 $\mu\Omega$/cm was obtained including the TiN layer. As result of open/short tests using a meandering pattern (line width 0.3-3 $\mu$m, length 40 mm) and comb pattern (line width 0.3-3 $\mu$m, length 40 mm), an effectively 100% yield was obtained.

Figure 17A:
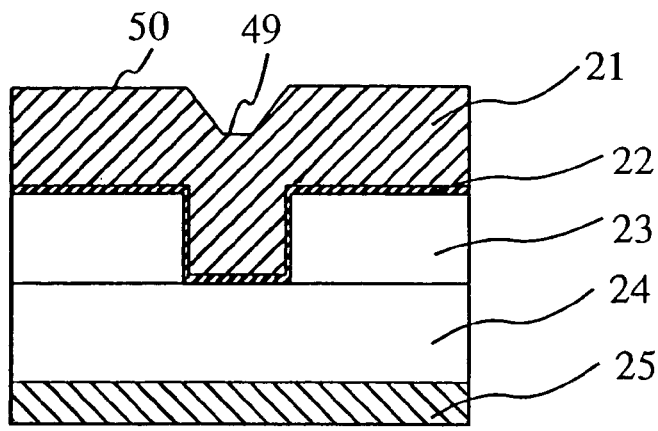
FIG. 17A is a diagram showing the cross-sectional structure of a plug of a sample before CMP.
Figure 17B:
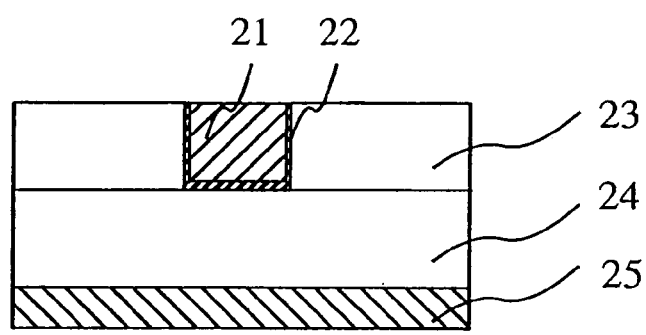
FIG. 17B is a diagram showing the cross-sectional structure of the plug of the sample after CMP.
Figure 17C:
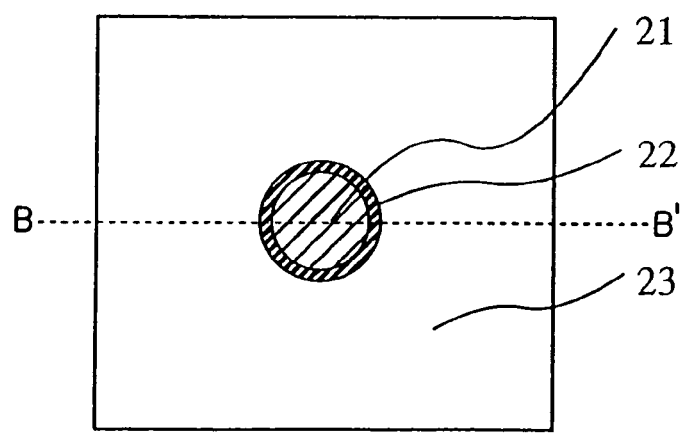
FIG. 17C is a plan view of the sample after CMP. The dotted line is the cross-section position of FIG. 17B.

Next, an example of forming a copper plug using the polishing solution of this invention will be given. The film-forming method and CMP conditions were identical to those for forming the above-mentioned inlaid interconnection. FIGS. 17A-17C show the structure of a copper plug of 0.5 $\mu$m diameter. FIG. 17A is a cross-section of the structure before CMP, FIG. 17B is a cross-section of the structure after CMP, and FIG. 17C is the structure viewed from above. In the case of a plug, the insulation film opening is no more than one $\mu$m, so the plug could be formed without dishing or erosion as shown in FIG. 17B even using a soft polishing pad (for example, Suba800 or XHGM1158 manufactured by the Rodel company). A hard polishing pad (IC1000) may of course also be used.

Figure 23:
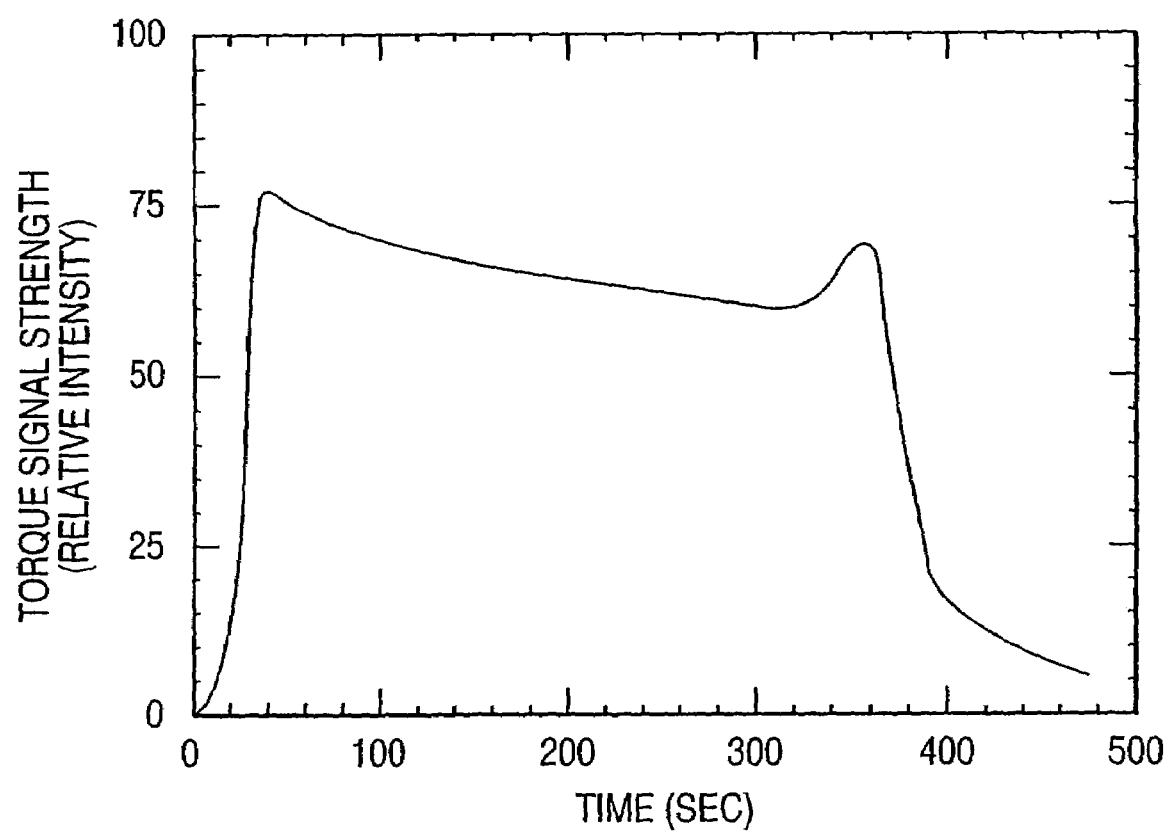
FIG. 23 is a diagram showing the result of end point detection from a torque signal strength of a CMP machine using a polishing solution according to this invention.

CMP end point detection was performed without problems. When the end point was detected based on the variation of rotation torque of the polishing platen or the wafer holder of the CMP machine, a signal shown in FIG. 23 was obtained. Polishing of Cu was completed after approximately 350 seconds elapsed. In the TiN polishing stage, the torque signal strength increased, and the strength dropped after approximately 400 seconds elapsed which was determined as the end point.

It was also possible to detect the end point based on the variation of the optical spectrum of the polishing solution after polishing.

Before polishing, the polishing solution was transparent, but when the copper is polished, copper ion dissolves in the polishing solution which therefore becomes blue.

Figure 24:
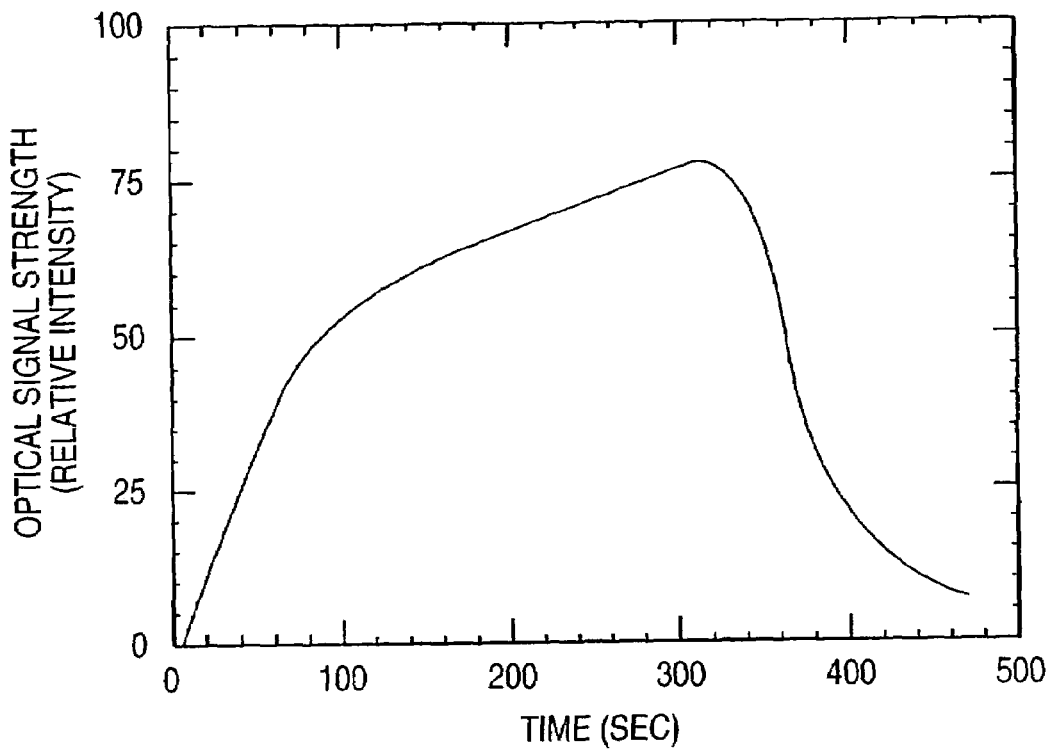
FIG. 24 is a diagram showing the result of end point detection from an optical signal strength using a polishing solution according to this invention.

When polishing was finished, and the optical signal intensity of the polishing solution which flowed out from the platen was measured at a wavelength of 725 nm, it was found that the intensity decreased after completion as shown in FIG. 24 so that the end point could be detected. As prior art polishing solution with added polishing abrasive is a white suspension, it was difficult to measure the variation of the optical spectrum. It was also possible to detect the end point by making a hole in the polishing pad, and measuring the variation of the light reflection spectrum from the wafer surface. In this case also, if the polishing solution contains abrasive, noise enters the signal due to the white suspension of polishing solution adhering to the wafer surface, so measurement was difficult.

According to this embodiment, citric acid was used as an acid, but the interconnection structure can also be formed if malic acid, malonic acid, succinic acid or dihydroxysuccinic acid is used instead of citric acid.

According to this embodiment, hydrogen peroxide was used as an oxidizer, but the interconnection structure can also be formed if ferric nitrate or potassium iodate is used instead of hydrogen peroxide. However, some method is needed against iron or potassium contamination.

An inlaid interconnection structure may be formed in the same way if CMP is performed using a polishing solution containing ammonium hydroxide, ammonium chloride or ammonium nitrate.

Embodiment 2

In this embodiment, a method will be described where an inhibitor is added to the polishing solution used in Embodiment 1 to further improve polishing characteristics.

Due to the addition of the inhibitor, the etching rate shown in FIG. 3 decreases, and the ratio of CMP rate to etching rate further increases. As a result, excessive etching of the copper surface during CMP can be prevented, and oxidation of the polished copper surface after CMP can be prevented.

The inhibitor was BTA. 0.1 wt % BTA was added to a polishing solution comprising 5 vol % aqueous hydrogen peroxide and 0.03 wt % citric acid mixed with pure water.

Even when BTA is added, the pH and oxidation-reduction potential of the polishing solution hardly change, and remain in the domain of corrosion of copper shown in FIG. 9.

The etching rate was measured as in Embodiment 1, and was found to have decreased to about 1/6 compared with the solution before BTA was added.

Figure 4C:
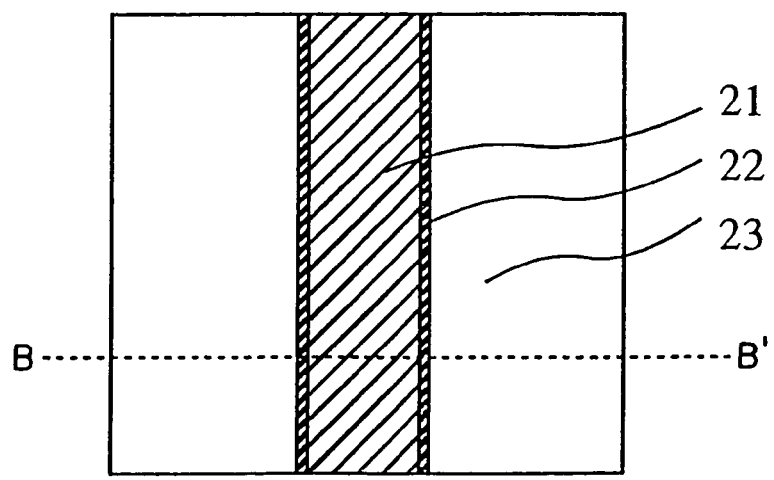
FIG. 4C is a plan view of the sample after CMP. The dotted line is the cross-section position of FIG. 4B.

CMP was performed under identical conditions to those of Embodiment 1 using this polishing solution. Corrosion of the polished copper surface was inhibited, and the inlaid interconnection shown in FIGS. 4A-4C was formed. When the electrical resistivity of the copper interconnection was measured, a value of 1.9 $\mu\Omega$/cm was obtained including the TiN layer. As a result of tests performed using a meandering pattern (line width 0.3-3 $\mu$m, length 40 mm) and comb pattern (line width 0.3-3 $\mu$m, length 40 mm), an effectively 100% yield was obtained.

Figure 16A:
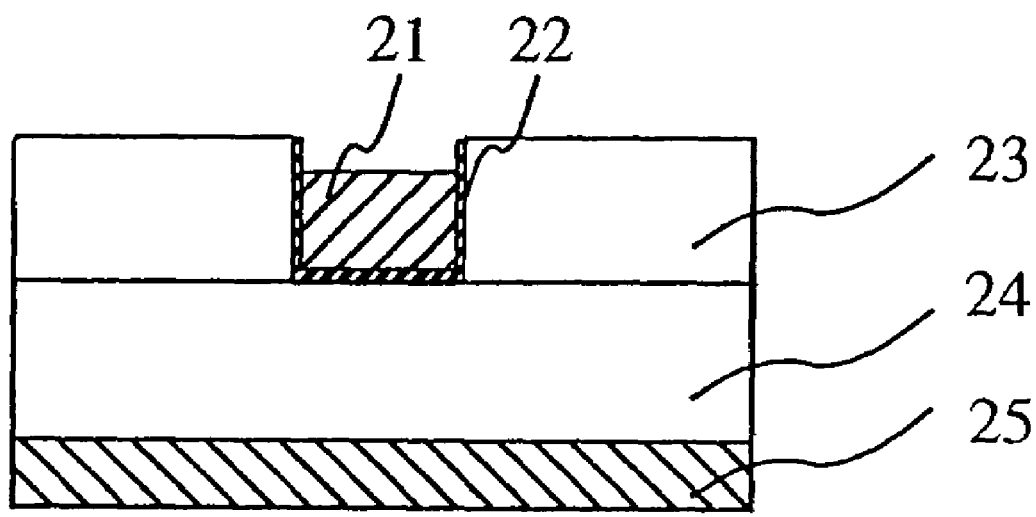
FIG. 16A is a diagram showing the cross-sectional structure of a sample wherein an interconnection part is etched by over-CMP.
Figure 16B:
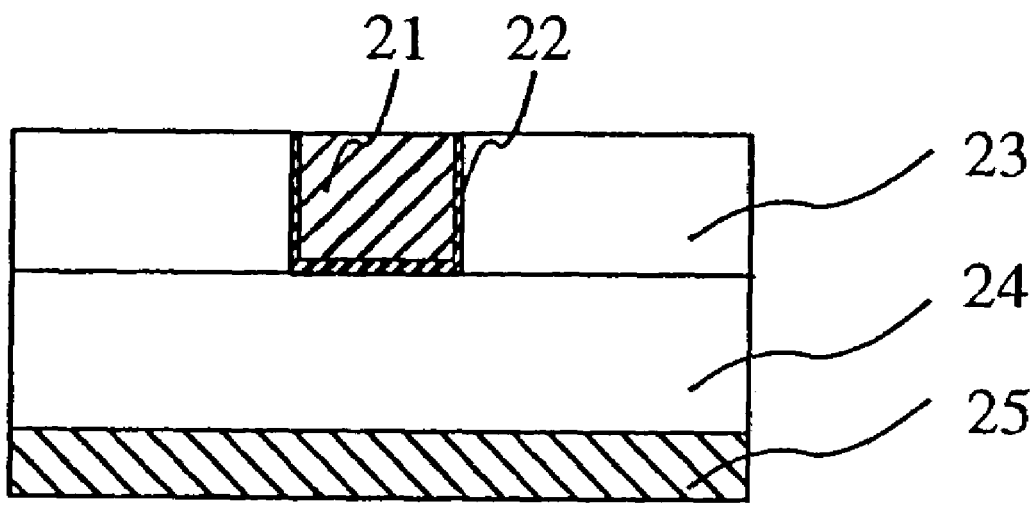
FIG. 16B is a diagram wherein etching is suppressed by an inhibitor.

When over-CMP was performed for a long time (e.g. twice the time), in the solution to which BTA was not added, the copper interconnection was etched to about 100 nm depth as shown in FIG. 16A and denting was observed compared to the surrounding insulation film, however by using the polishing solution to which BTA was added, this was suppressed to several 10 nm or less as shown in FIG. 16B. Over-CMP is performed to prevent polishing residues over the whole wafer.

An interconnection structure could also be formed even if the above-mentioned polishing solution was concentrated. For example, good results were obtained with a solution comprising 30 vol % aqueous hydrogen peroxide, 0.15 wt % citric acid and 0.3 wt % BTA mixed with pure water. When the polishing solution was concentrated, the polishing uniformity in the wafer improved, i.e. whereas the uniformity was 10% or more with a dilute polishing solution, it was 8% or less with a concentrated polishing solution. However, a dilute solution has the advantage of being able to be manufactured more cheaply.

According to this embodiment, citric acid was used as an acid, but the interconnection structure can also be formed if malic acid, malonic acid, succinic acid or dihydroxysuccinic acid is used instead of citric acid. For example, good results were obtained with a solution comprising 30 vol % aqueous hydrogen peroxide, 0.15 wt % malic acid and 0.2 wt % BTA mixed with pure water.

Even when ammonium hydroxide is used as a substance to render the metal water-soluble, the above-mentioned result is achieved by a polishing solution with added BTA, and an inlaid copper interconnection can still be formed.

Embodiment 3

In this embodiment, the suppression of dishing and erosion due to decrease of the abrasive concentration was examined. The polishing solution of Embodiment 2 (5 vol % aqueous hydrogen peroxide, 0.03 wt % citric acid and 0.01% BTA mixed with pure water), and the same polishing solution with 2.5 wt % added alumina abrasive (particle diameter: approx. 200 nm) as a comparison, were prepared.

Figure 5A:
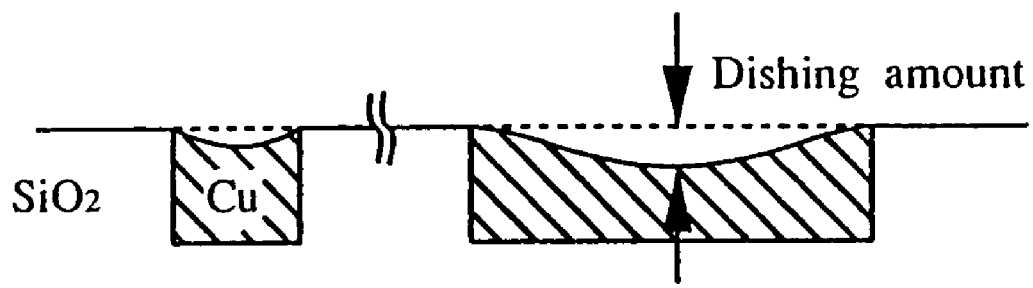
FIG. 5A is a diagram of dishing.
Figure 5B:
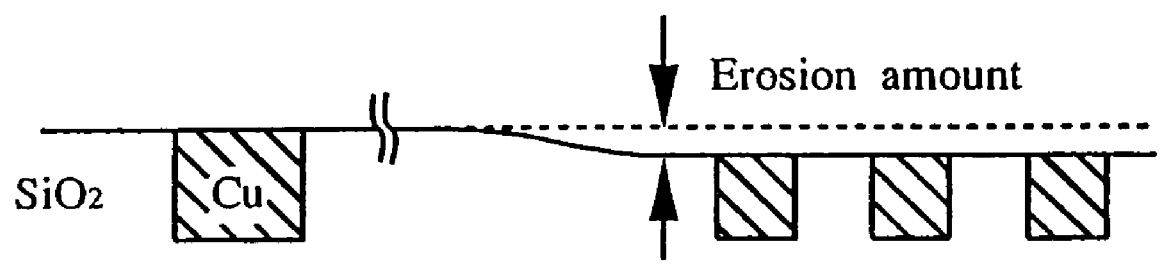
FIG. 5B is a diagram of erosion.

An inlaid interconnection was formed as in Embodiment 2 using these polishing solutions, and the line width dependence of dishing and erosion defined in FIGS. 5A-5B was measured for a width of 0.4-90 μm by photographing a 400 μm length of the interconnection in section with a scanning electron microscope (SEM).

Figure 6A:
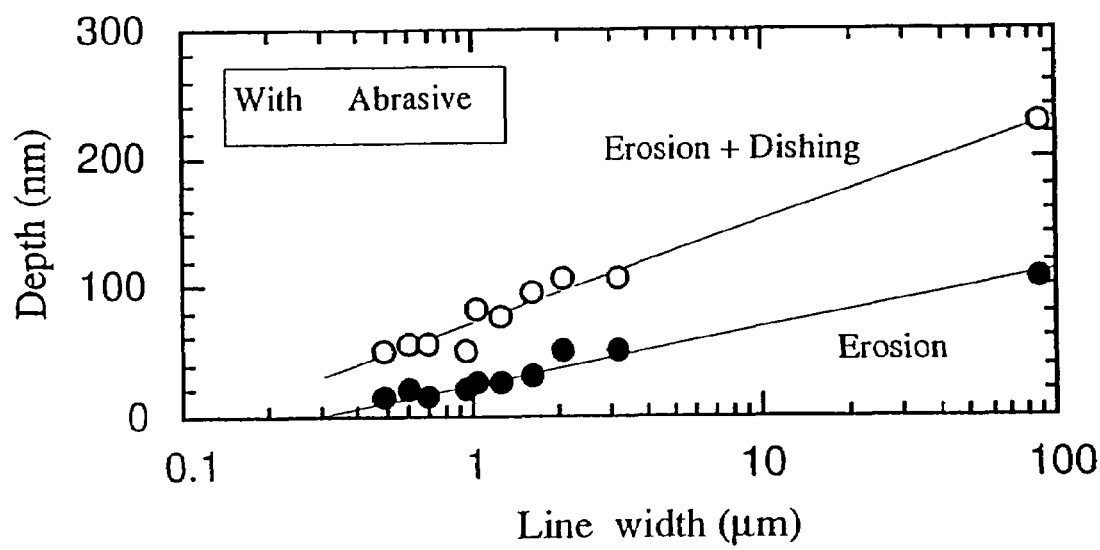
FIGS. 6A, 6B are diagrams showing the effect of this invention.
Figure 6B:
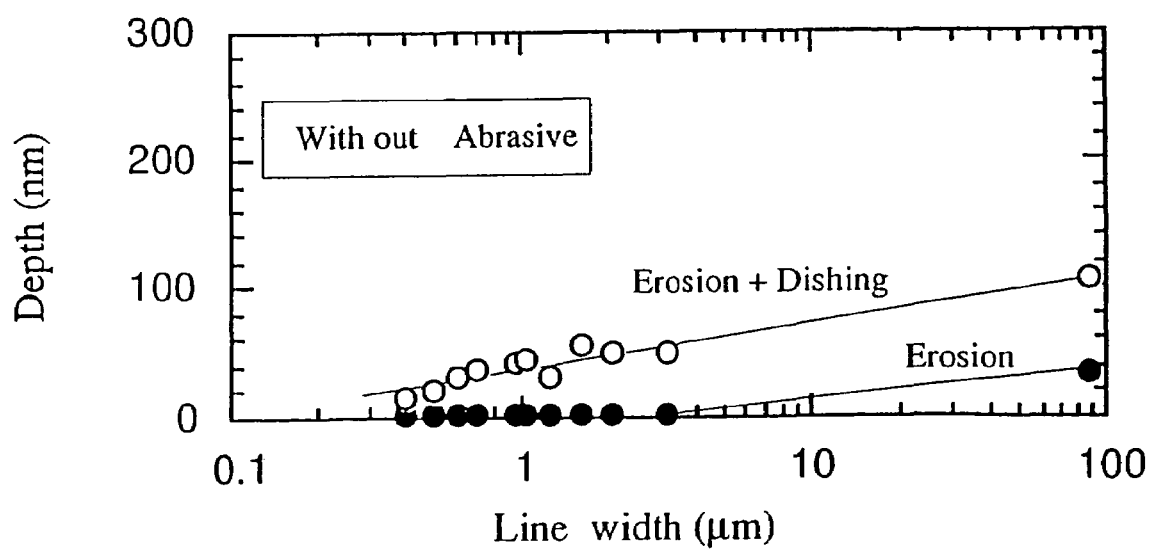
Figure 7A:
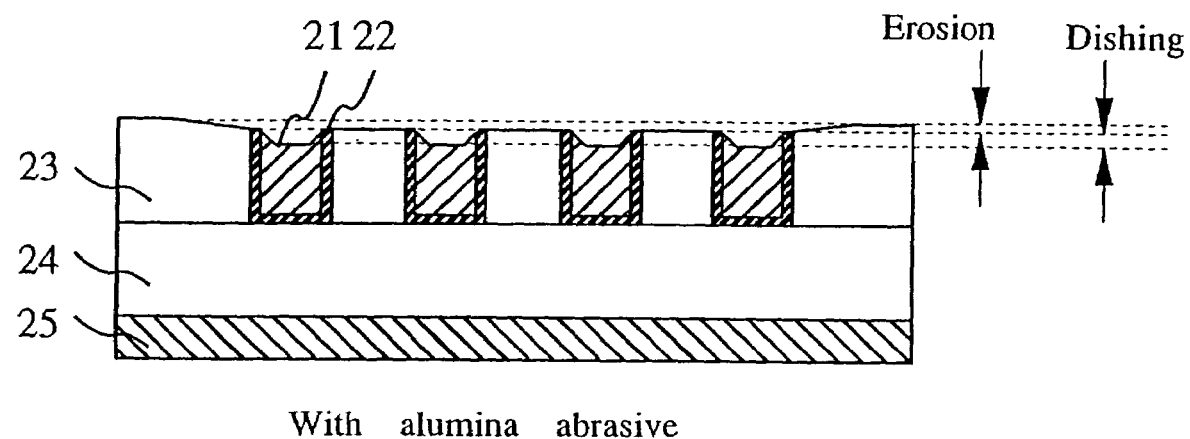
FIG. 7A is a cross-sectional view of a sample on which CMP was performed according to the prior art method.
Figure 7B:
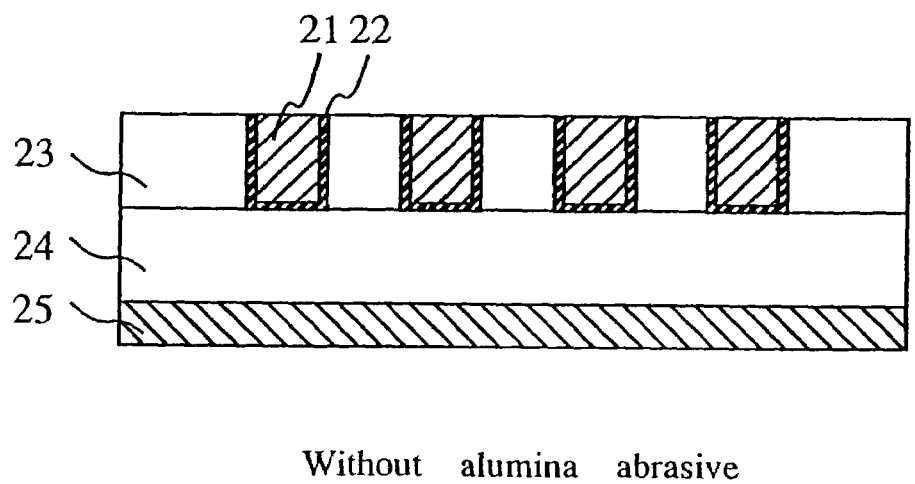
FIG. 7B is a cross-sectional view of a sample on which CMP was performed according to the method of this invention.

FIGS. 6A, 6B show the measurement results, and FIGS. 7A, 7B, 8A, and 8B show sections which were drawn based on the SEM observations.

From FIGS. 6A, 6B it is seen that the dishing amount and erosion amount increased as the line width increased. However, the dishing amount decreased to about half by eliminating the alumina abrasive, and the erosion amount at a line width of 4 μm or less decreased to a level at which it was almost unobservable by SEM (10 nm or less). From a comparison of FIGS. 8A, 8B, a remarkable difference was observed at a line width of 90 μm.

Next, the dependence of dishing and erosion on alumina abrasive concentration was examined. Both values were measured according to the definition shown in FIGS. 5A, 5B. Seven polishing solutions were prepared with different alumina abrasive concentrations, i.e. 0.0001 wt %, 0.001 wt %, 0.01 wt %, 0.05 wt %, 0.1 wt %, 0.5 wt %, and 1 wt %.

As a result, when the alumina abrasive concentration was 0.05 wt % or less, approximately the same values were obtained as for the polishing solution without alumina abrasive. The result coincided with that of FIG. 6B within the limits of error (20 nm or less).

From this, it is seen that when CMP is performed using a polishing solution having an alumina abrasive concentration of 0.05 wt % or less, an inlaid interconnection structure can be formed wherein dishing and erosion are suppressed.

Embodiment 4

In this embodiment, the suppression of scratches by reducing the abrasive concentration was examined.

The polishing solution of Embodiment 2 (5 vol % aqueous hydrogen peroxide, 0.03 wt % citric acid and 0.01% BTA mixed with pure water), and polishing solutions with 0.0001 wt %, 0.001 wt %, 0.01 wt %, 0.05 wt %, 0.1 wt %, 0.5 wt %, 1 wt %, 2.5 wt % and 5 wt % alumina abrasive (particle diameter: approx. 200 nm) added to this solution, were prepared.

CMP was performed using these solutions on a copper thin film surface with no interconnection pattern and a silicon dioxide film surface.

As a result, on the silicon dioxide film surface on which CMP was performed using a polishing solution having an alumina abrasive concentration of 1 wt % or more, 100-1000 point scratches were observed per wafer with an optical microscope as shown in FIG. 25, but this was suppressed to the level of several scratches in a wafer on which CMP was performed using a polishing solution having an alumina abrasive concentration of 0.5 wt % or less. As the scratch size is one μm or less, this number of scratches poses no problem from the viewpoint of forming the interconnection structure.

Next, the type of scratches formed on the copper surface was examined. On a copper surface where CMP was performed using a polishing solution having an alumina abrasive concentration of 0.5 wt % or more, linear scratches were produced which could be distinguished by visual observation under a flood light. As the alumina abrasive concentration increased, the number of scratches per wafer tended to increase. Only a few scratches occurred in a wafer on which CMP had been performed using a polishing solution having an alumina abrasive concentration of 0.1 wt %, but when a section of the wafer was observed by SEM and surface imperfections were observed by AFM (atomic force microscope), it was found that the depth of these scratches was of the order of 100 nm. As the depth of the inlaid interconnection is 500 nm, 100 nm scratches are a problem.

On a copper surface where CMP was performed using a polishing solution having an alumina abrasive concentration of less than 0.1 wt %, the scratches that could be distinguished by visual observation disappeared. When these samples were observed by SEM and AFM, it was found that the depth of the scratches was of the order of 10 nm. At this level, there is almost no effect on the electrical resistance of the interconnection.

Further, as scratches can be reduced, the down force and platen rotation speed can be increased, so the CMP rate can be increased.

An inlaid interconnection was formed by the same method as that of Embodiment 1 using the polishing solution having an abrasive concentration of less than 0.1 wt %. As a result of a continuity/insulation test performed using a meandering pattern (line width 0.3-3 μm, length 40 mm) and comb pattern (line width 0.3-3 μm, length 40 mm), an effectively 100% yield was obtained.

Embodiment 5

In this embodiment, the suppression of peeling by reducing the abrasive concentration was examined.

The polishing solution of Embodiment 2 (5 vol % aqueous hydrogen peroxide, 0.03 wt % citric acid and 0.01 wt % BTA mixed with pure water), and polishing solutions with 0.0001 wt %, 0.001 wt %, 0.01 wt %, 0.05 wt %, 0.1 wt %, 0.5 wt %, 1 wt %, 5 wt % and 10 wt % alumina abrasive added to this solution, were prepared. A sample was prepared by forming a thin copper film of thickness 800 nm on a silicon dioxide film surface by sputtering, with a TiN layer of thickness 5 nm (1/10 the thickness of Embodiment 1) in between. CMP was performed on this sample using the aforesaid polishing solutions.

As a result, peeling occurred between the copper layer and the TiN layer from the periphery of a wafer on which CMP was performed using a polishing solution having an alumina abrasive concentration of 1 wt % or more. This is considered to be due to the frictional force which occurs between the alumina abrasive and the copper surface. The frictional force decreased in a wafer on which CMP was performed using a polishing solution having an alumina abrasive concentration of 0.5 wt % or less, and in this case, no peeling occurred at all. Further, as peeling is reduced, the down force and platen rotation speed can be increased, so the CMP rate can be increased.

An inlaid interconnection was formed by the same method as that of Embodiment 2 using the polishing solution having an abrasive concentration of 0.5 wt % or less. A sample was used wherein the TiN layer 22 of FIGS. 4A-4C was 5 nm. As a result, an inlaid interconnection was formed without any peeling of the thin copper film.

Embodiment 6

In this embodiment, the improvement of cleaning by reducing the abrasive concentration was examined.

The polishing solution of Embodiment 2 (5 vol % aqueous hydrogen peroxide, 0.03 wt % citric acid and 0.1 wt % BTA mixed with pure water), and polishing solutions with 0.0001 wt %, 0.001 wt %, 0.01 wt %, 0.05 wt %, 0.1 wt %, 0.5 wt %, 1 wt %, 5 wt % and 10 wt % alumina abrasive added to this solution, were prepared.

Using these solutions, the copper thin film and TiN thin film formed on the silicon dioxide film surface were removed by CMP, and after the silicon dioxide film surface which appeared was washed with pure water, the alumina abrasive (number of defects) which remained was examined with a wafer particle counter.

The number of defects having a size of 0.2 μm or larger per wafer was measured. The size of the wafer was 4 inches.

As a result, it was found that the number of defects decreased according to decrease of alumina abrasive concentration as shown in FIG. 10, and at a concentration of 0.01 wt % or less, the number can be reduced to 100 or less by megasonic cleaning alone.

In the prior art, as a polishing solution having an alumina abrasive concentration of 1 wt % or more was used, the number of defects was reduced to 100 or less by polyvinyl alcohol (PVA) brush-cleaning together with megasonic cleaning. Therefore, by polishing with a polishing solution having an abrasive concentration of 0.01 wt % or less, the number of cleaning steps can be reduced. Otherwise, if the same number of cleaning steps is used as in the prior art, the number of foreign particles can be further reduced.

Embodiment 7

In this embodiment, the number of CMP processing steps is reduced by reducing the abrasive concentration.

FIG. 11 shows a CMP process where a prior art polishing solution was used. In a prior art CMP machine, the alumina abrasive concentration was as high as, for example, 1 wt % or more, and conditioning of the polishing pad was performed for several tens of seconds to a few minutes before CMP to prevent clogging of the polishing pad with abrasive.

Also, after metal CMP to form an inlaid interconnection, CMP was performed on the insulating film from several tens of seconds to about 2 minutes to remove the damaged layer of the insulating film surface, e.g. the silicon dioxide film exposed by polishing. Subsequently, the wafer was subjected to a cleaning step without drying, and a first brush cleaning was performed with ammonia solution to remove abrasive. A second brush cleaning with dilute hydrofluoric acid (HF) was performed to remove metal contamination in the damaged layer of the insulating film surface, e.g. the silicon dioxide film. Finally, after removing abrasive to the desired level by megasonic cleaning, the wafer was dried.

FIG. 12 shows the whole CMP process when a polishing solution having a low polishing abrasive concentration of less than 0.01 wt % according to this invention was used. As there is almost no longer any clogging by abrasive in the CMP machine, conditioning is practically unnecessary except in the case of a new polishing pad. If the abrasive concentration was $1/10$, the life of the polishing pad was extended 10 times. Also, as there is no damaged layer due to scratching of the silicon dioxide film surface, it is not necessary to perform CMP on the insulating film. In the cleaning step, the prior art level (number of defects) could be attained by megasonic cleaning alone.

Heavy metal contamination was evaluated by total reflection fluorescent X rays, and it was also found here that the prior art level could be attained by megasonic cleaning alone.

Finally, compared to the prior art CMP process, the process time was shortened to about ½.

The process of FIG. 12 may be used in practice if the abrasive concentration is 0.01 wt % or less, but it is preferably 0.005 wt % or less.

Embodiment 8

In this embodiment, the reduction of polishing pad and slurry cost due to decrease of abrasive concentration was examined.

If the CMP time including over-polishing time for a CMP alumina slurry used for copper CMP is 5 min, and the slurry is supplied to a CMP machine at a rate of 100 cc/min, one liter is used for one CMP. One polishing pad is consumed approximately every 400 wafers. In addition, apart from the CMP machine, a post-cleaning machine is necessary.

The breakdown of CMP-related costs when CMP is performed using a prior art polishing solution having an alumina abrasive concentration of 1 wt % or more is shown in FIG. 13. It is seen that, unlike the case of other semiconductor-related equipment, the cost of the slurry and polishing pads which are consumable items is 70% of the total.

On the other hand, in the polishing solution of this invention, CMP costs are largely reduced by decreasing the alumina abrasive concentration to 0.001 wt % or less. The reagents added to the polishing solution are still required, but the cost is of the order of $1/100$ of a prior art alumina slurry. Further, as the conditioning frequency in the prior art is less, the cost of polishing pads can also be reduced.

Regarding the CMP machine, if the alumina abrasive concentration is 0.0001 wt % or less, a slurry supply equipment, slurry stirring equipment and slurry processing equipment are unnecessary, and if the alumina abrasive concentration is zero, there is no need for dust prevention measures in the clean room and costs can be largely reduced compared to the prior art machine. As for cleaning machine, brush-cleaning is unnecessary, so the cost is about half. Hence, about 70% of the cost of CMP as a whole can be reduced by using the polishing solution of this invention.

Embodiment 9

In this embodiment, a method will be described for forming an inlaid copper interconnection with a polishing solution which uses nitric acid and BTA. Nitric acid has an oxidizing action on copper, and as copper is made water-soluble by the acidic nature of nitric acid, two of the functions of this invention may be realized by one reagent. BTA suppresses etching as in the case of Embodiment 2, so the ratio of CMP rate and etching rate is increased. Excessive etching of the copper surface during CMP can therefore be prevented, and excessive oxidation of the polished copper surface after CMP can also be prevented. The polishing solution is an aqueous solution comprising nitric acid: 0.2 vol % and BTA: 0.01 wt % mixed with pure water. This polishing solution is in the domain of corrosion of copper, as shown in FIG. 9.

The etching rate of copper was examined as in Embodiment 1, and found to be reduced to about ⅙ due to the addition of BTA. When CMP was performed using this polishing solution under the same conditions as those of Embodiment 1, corrosion of the polished copper surface was prevented and an inlaid interconnection could be formed.

When the electrical resistivity of the copper interconnection was measured, a value of 1.9 μΩ/cm was obtained including the TiN layer. As a result of open/short tests using a meandering pattern (line width 0.3-3 μm, length 40 mm) and comb pattern (line width 0.3-3 μm, length 40 mm), an effectively 100% yield was obtained.

In a polishing solution to which BTA is not added, the copper interconnection part is etched and was observed to be more depressed than the surrounding insulating film (in particular, the copper disappeared when the nitric acid concentration was as high as 1 vol % or more). This was suppressed to several 10 nm or less as shown in FIG. 16B when a polishing solution with added BTA was used.

When alumina abrasive was added to this polishing solution, scratches occurred on the polished copper surface at a concentration exceeding 0.1 wt %, and on the silicon dioxide film at a concentration exceeding 1 wt %. Peeling also occurred when CMP was performed on a copper thin film having a TiN adhesion layer of 5 nm using a polishing solution having a concentration exceeding 0.5 wt %. Scratches and peeling were prevented by reducing the alumina abrasive to below these concentrations. It was also found that at a concentration of 0.01 wt % or below, the number of defects was reduced to 100 or less by megasonic cleaning alone, and brush cleaning with a reagent was unnecessary.

Next, dishing and erosion of the inlaid interconnection were evaluated. As in the case of the results shown in FIGS. 6A-6B, when the alumina abrasive concentration was 0.05 wt % or less, both values were of the same order as for a polishing solution not containing alumina abrasive, and the results coincided with those of FIG. 6B within the limits of error (20 nm or less). Therefore, an inlaid interconnection structure and plug structure with suppressed dishing and erosion as shown in FIGS. 4A-4C and FIGS. 17A-17C could be formed by performing CMP using this polishing solution.

Embodiment 10

In this embodiment, a multilayered interconnection structure was prepared using the polishing solution of Embodiment 2 (30 vol % aqueous hydrogen peroxide, 0.15 wt % malic acid and 0.2 wt % BTA mixed with pure water), and experiments were performed to demonstrate its effect. As a comparison, CMP was performed using a prior art polishing solution comprising 1 wt % of alumina abrasive.

Figure 14A:
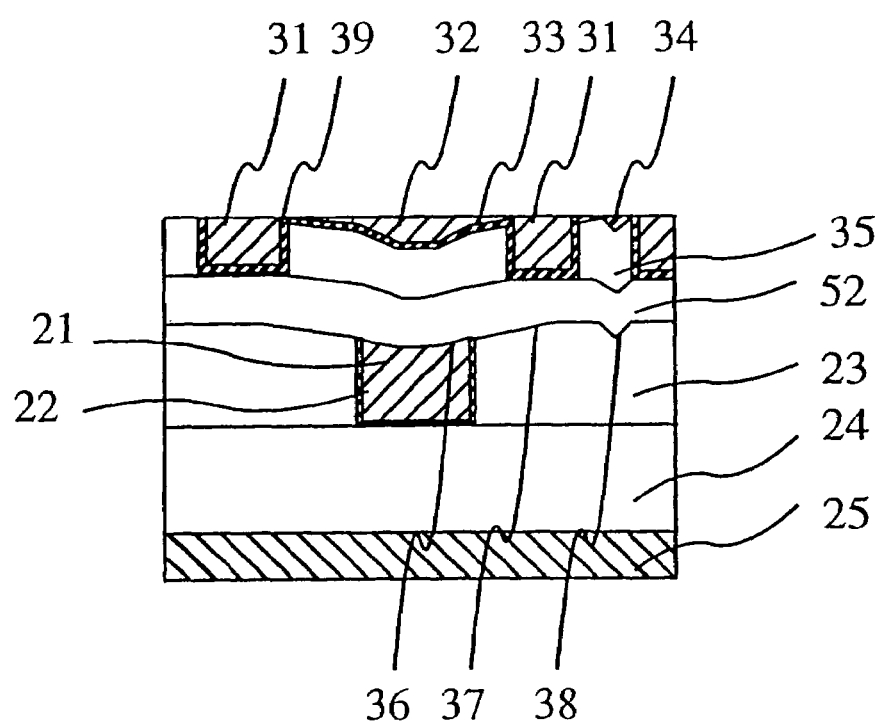
FIG. 14A is a diagram showing the cross-sectional structure of a sample wherein a multi-layer interconnection is formed by a prior art polishing solution.
Figure 14B:
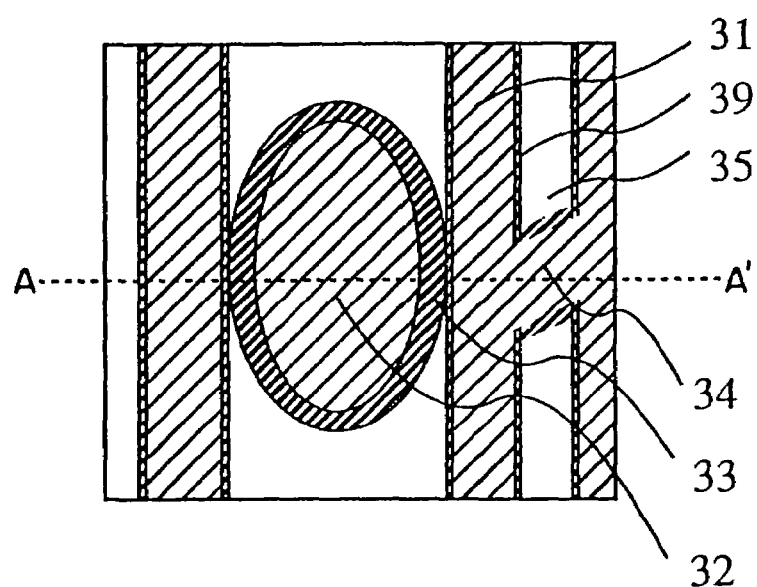
FIG. 14B is a plan view of the sample. The dotted line is the cross-section position of FIG. 14A.

FIGS. 14A-14C show a two-layer interconnection structure obtained as a result of performing CMP using a prior art polishing solution. A semiconductor device was manufactured comprising diffusion layers such as a source and drain in a silicon substrate 25, but this will not be described here (same for FIGS. 15-20). As a result of surface depression due to dishing 36, erosion 37 and scratches 38 produced in an insulating film 23 between first layer interconnections 21, polishing residues 32, 33 and 34 were also left on the surface of an insulating film 35 formed on top, and these polishing residues caused electrical short-circuits in second layer copper interconnections 31, 39 is a TiN layer and 52 is a throughhole layer insulating film.

Figure 15A:
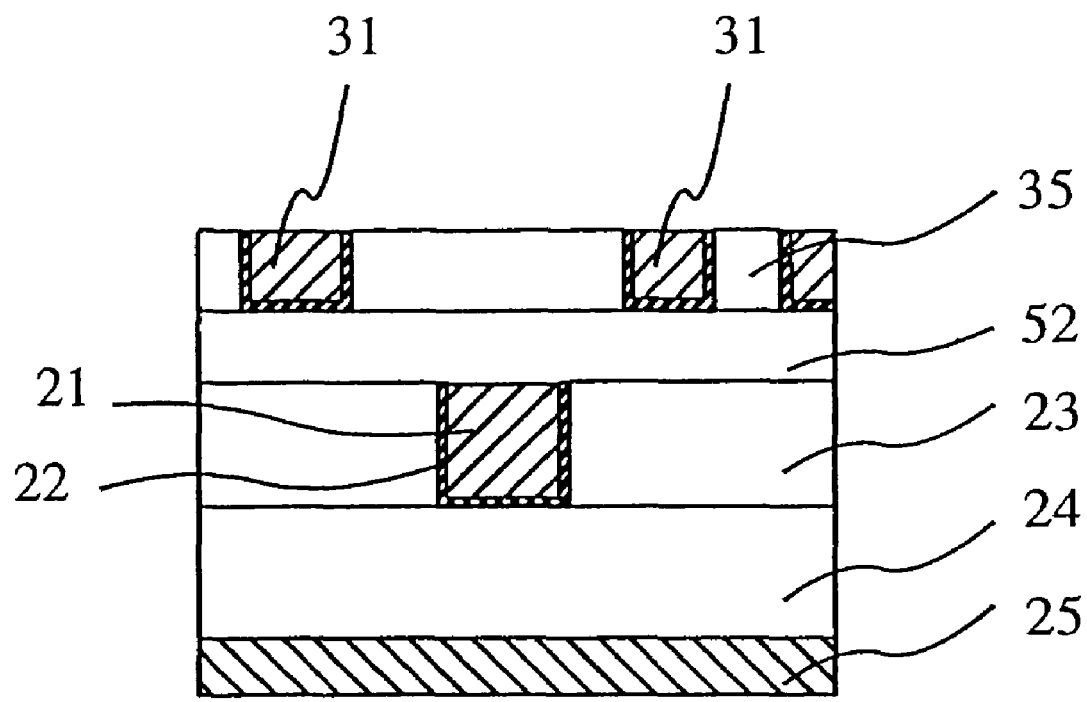
FIG. 15A is a diagram showing the cross-sectional structure of a sample wherein a multi-layer interconnection is formed using a polishing solution according to this invention.
Figure 15B:
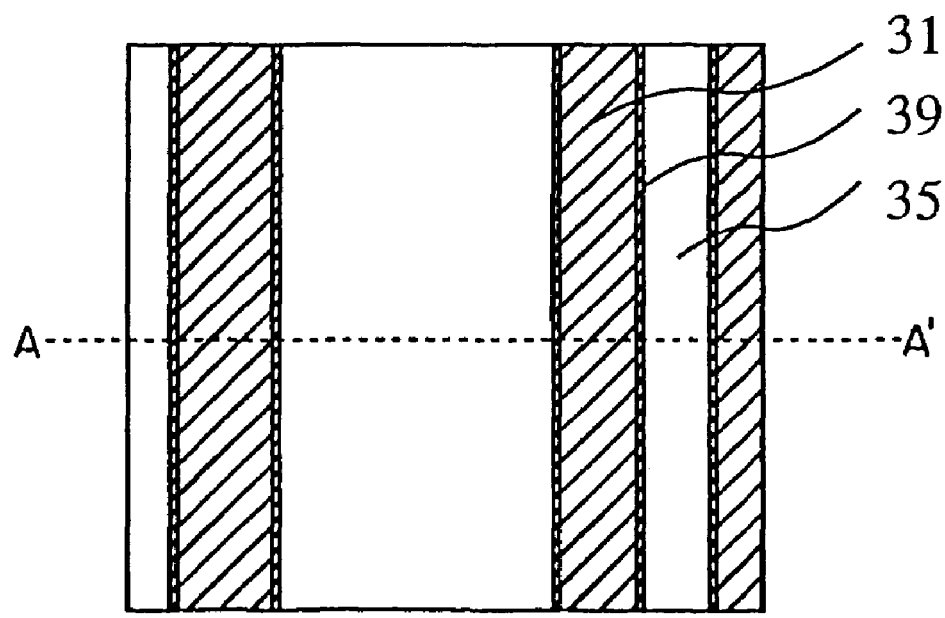
FIG. 15B is a plan view of the sample. The dotted line is the cross-section position of FIG. 15A.

On the other hand, in a sample wherein CMP was performed using a polishing solution not containing abrasive, this problem did not occur as shown in FIGS. 15A-15B. As there is no TiN layer above the copper interconnections, there is a possibility that copper will diffuse into the silicon dioxide film and contaminate the semiconductor device. To prevent this, a silicon nitride film is formed on the copper interconnections to a thickness of 50 nm, but this is not shown in FIGS. 14A, 14B, 15A, and 15B (it is also omitted from FIGS. 18A, 18B, 19A, 19B, 20A, and 20B).

Figure 18A:
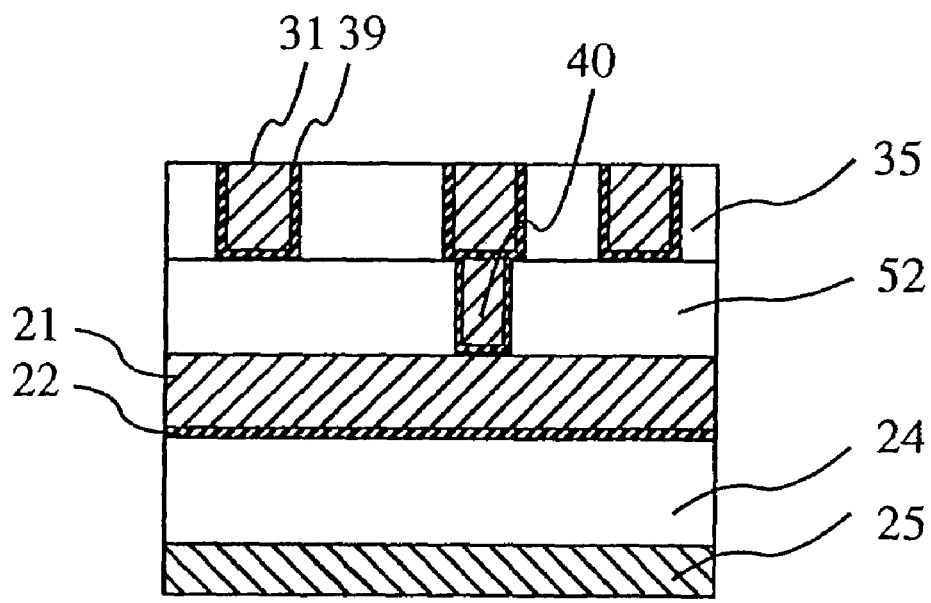
FIG. 18A is a diagram showing the cross-sectional structure of a sample wherein a multi-layer interconnection is formed using a polishing solution according to this invention.
Figure 18B:
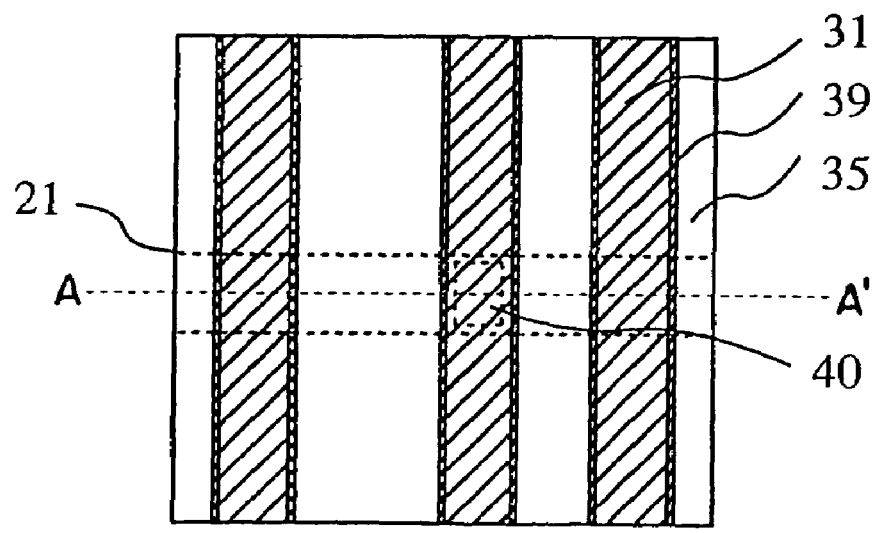
FIG. 18B is a plan view of the sample. The dotted line is the cross-section position of FIG. 18A.
Figure 19A:
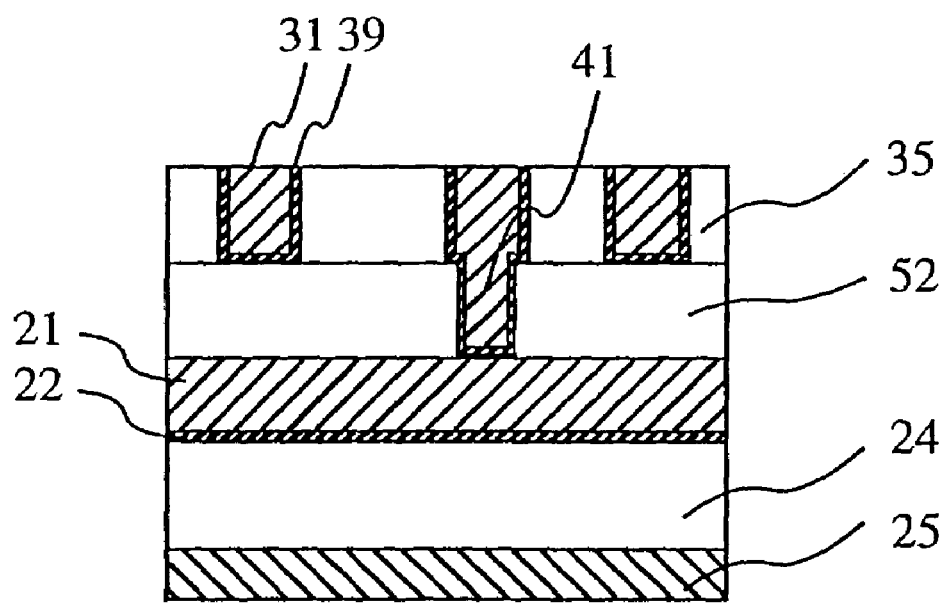
FIG. 19A is a diagram showing the cross sectional structure of a sample wherein a multi-layer interconnection is formed by a dual damascene method using a polishing solution according to this invention.
Figure 19B:
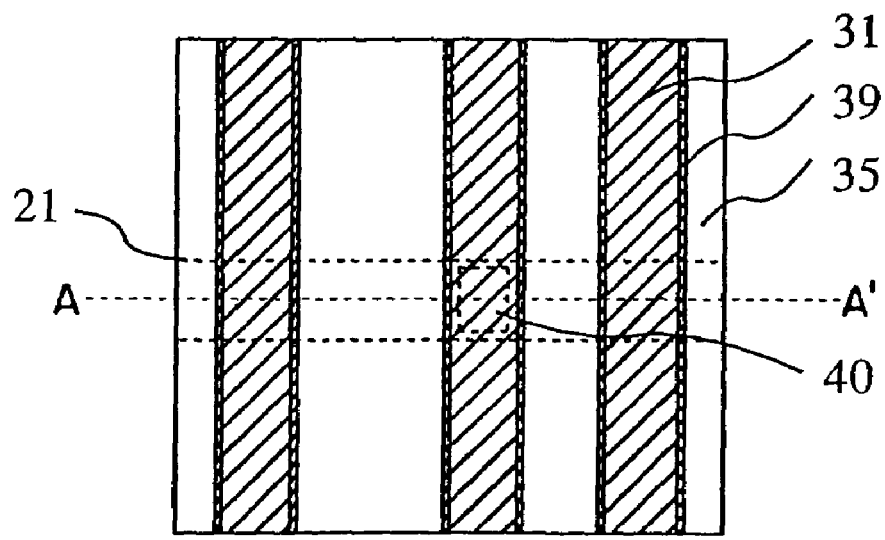
FIG. 19B is a plan view of the sample. The dotted line is the cross-section position of FIG. 19A.

FIGS. 18A and 18B show a part wherein the first layer interconnection 21 and second layer interconnection 31 are connected by a copper plug 40. This device was manufactured by performing CMP using the aforesaid polishing solution on each layer including the plug. There were no electrical short-circuits whatever due to the dishing, erosion and scratches shown in FIGS. 14A-14B. A multi-layer interconnection could also be formed in the same way using the polishing solutions described in Embodiment 1 and Embodiment 9.

Figure 20A:
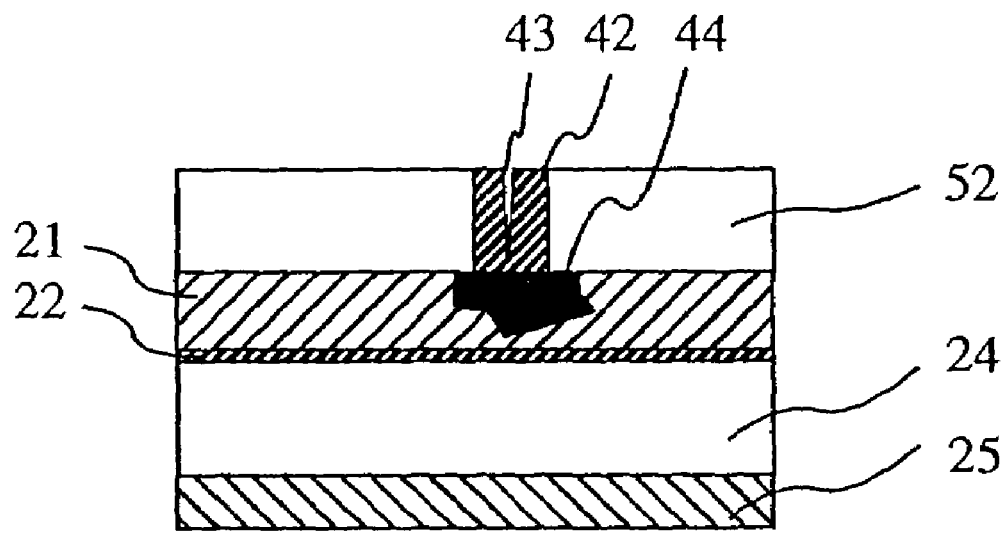
FIG. 20A shows corrosion of a base layer copper interconnection due to seepage of tungsten polishing solution when a tungsten plug is formed by a polishing solution according to this invention.
Figure 20B:
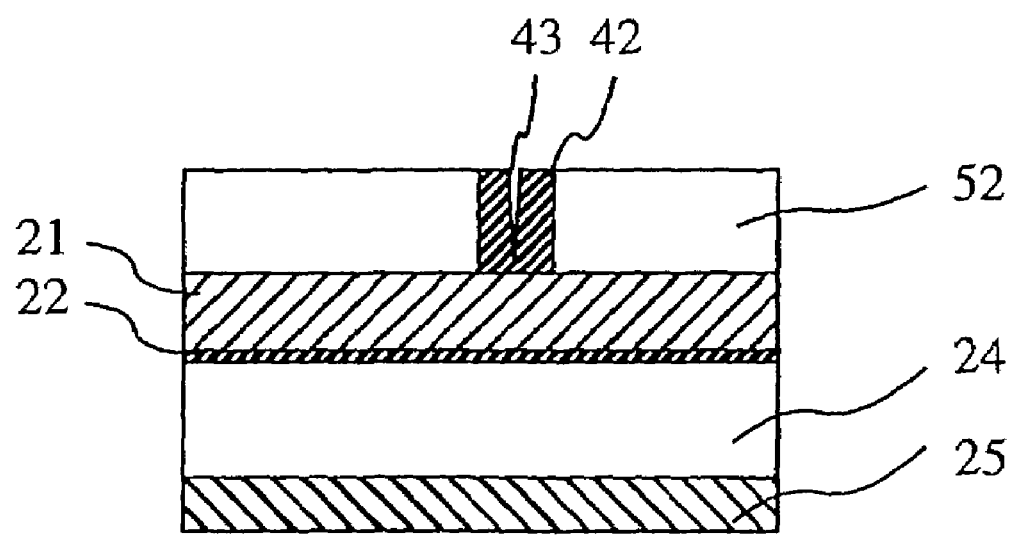
FIG. 20B shows inhibition of corrosion due to the addition of BTA to the tungsten polishing solution.

The plug may also be formed by a tungsten film using the CVD method which has a high coverage performance, as shown in FIGS. 20A-20B. However in the case of tungsten, a seam 43 (known also as a keyhole, etc.) is easily formed in the center part of the plug, and polishing solution may seep into the interior of the device and rapidly corrode the base copper interconnection 21. FIG. 20A shows this situation 44 is a corroded copper interconnection part. By adding a copper inhibitor, for example BTA, to the tungsten polishing solution, corrosion of the copper interconnection was prevented until polishing solution that had seeped into the tungsten was removed in the cleaning step. FIG. 20B shows this result, Also, as the polishing solution does not contain abrasive, abrasive does not remain in the seam.

FIG. 19 shows a sample wherein a two-layer interconnection is formed by a dual damascene method. This is a technique wherein a plug for the first layer interconnection and the second layer interconnection are polished in one step. After polishing the first layer interconnection with the aforesaid polishing solution, the plug and second layer interconnection were then polished by CMP with the aforesaid polishing solution. Numeral 41 is the plug formed by the dual damascene method. There were no electrical short-circuits whatever due to the dishing, erosion and scratches shown in FIGS. 14A and 14B. A multi-layer interconnection could also be formed in the same way using the polishing solutions described in Embodiment 1 and Embodiment 9.

Figure 21:
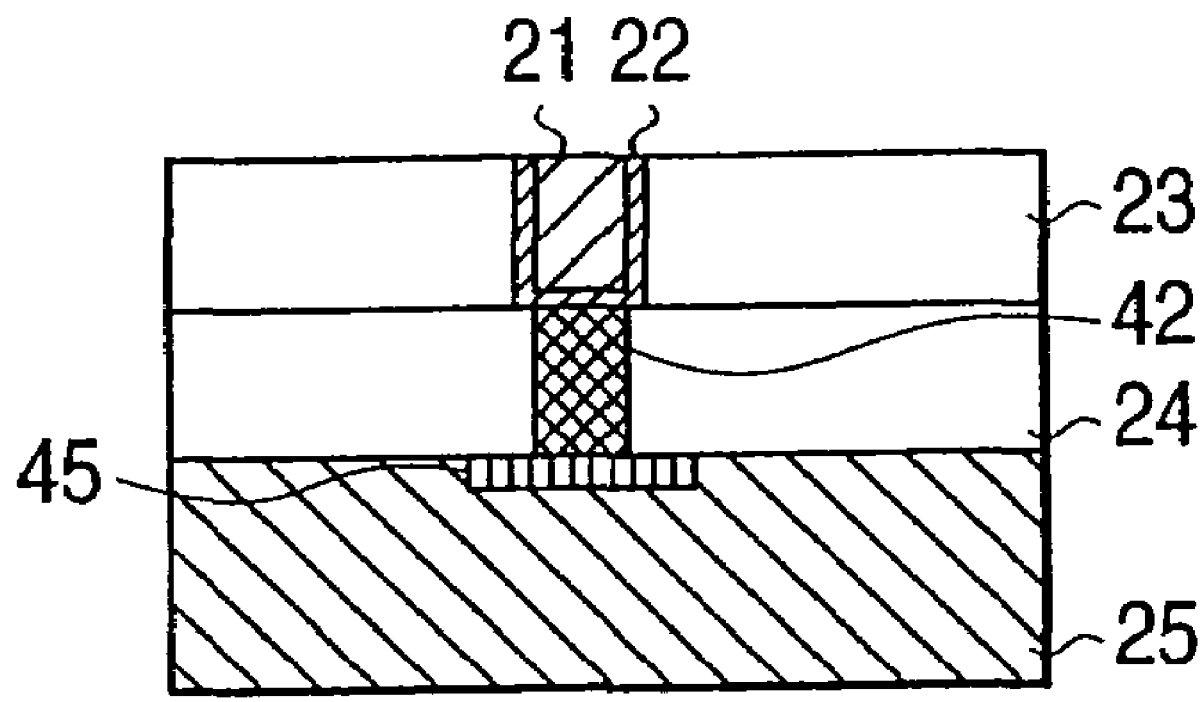
FIG. 21 is a cross-sectional view of a sample showing a plug and interconnection formed on a diffusion layer of a substrate using a polishing solution according to this invention.
Figure 22A:
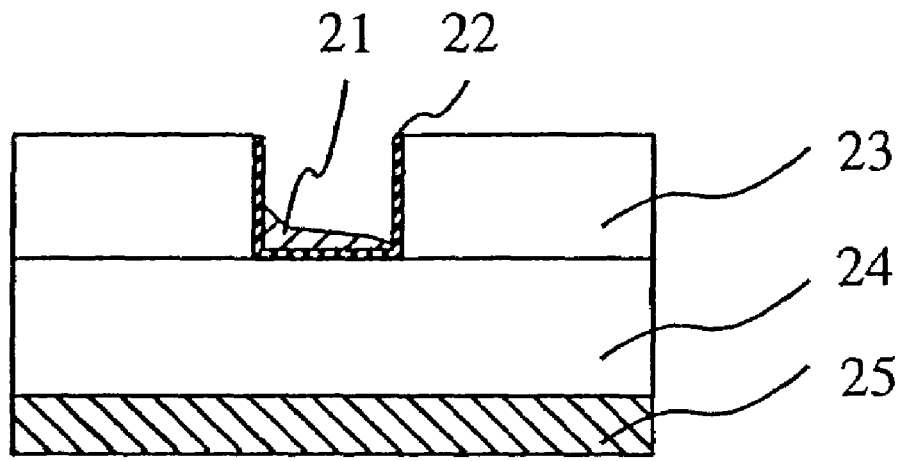
FIG. 22A is a cross-sectional view of an interconnection part of a sample on which CMP was performed using an aminoacetic acid-based polishing solution.
Figure 22B:
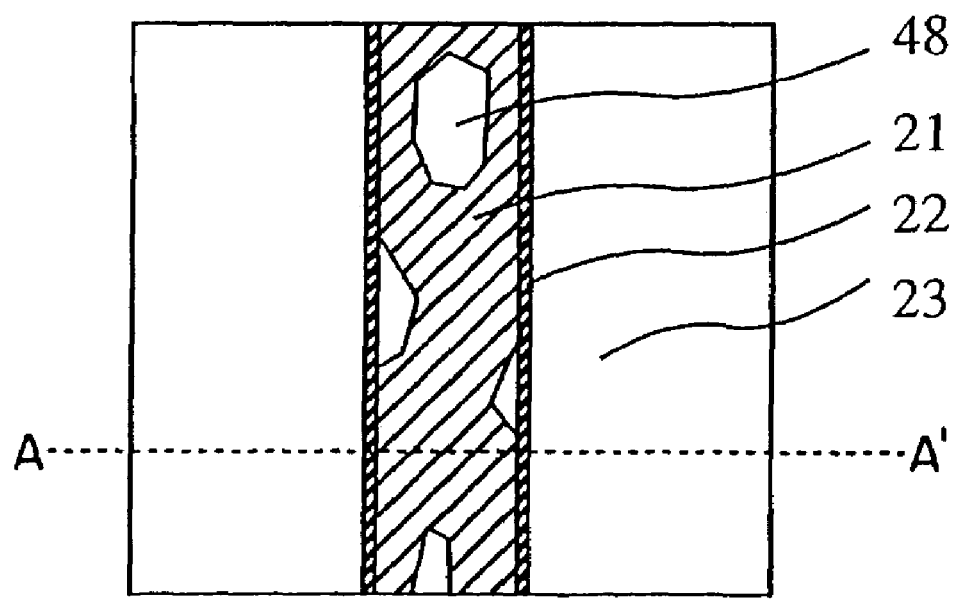
FIG. 22B is a plan view of the sample. The dotted line is the cross-section position of FIG. 22A.

FIG. 21 shows a situation wherein a tungsten plug 42 is formed on an impurity-doped layer 45 of a silicon substrate and connected to the copper interconnection 21 using the polishing solution of this invention. It was confirmed that, by forming a multi-layer interconnection as described hereabove on this upper layer, an LSI could be manufactured and operated by connecting different semiconductor devices.

In the method of performing CMP using the polishing solution not containing a polishing abrasive according to this invention, scratches, peeling, dishing and erosion are suppressed compared to the prior art method of performing CMP using a polishing solution containing a polishing abrasive. A complex cleaning process and slurry supply/processing equipment are not required, the cost of consumable items such as slurry and polishing pads is reduced, and CMP is performed at a practical CMP rate.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

What is claimed is:

1. A polishing method comprising:
   chemically mechanically polishing a metal film using a polishing solution which additionally has included therein less than 1 wt % of a polishing abrasive, said solution having a pH and oxidation-reduction potential in the domain of corrosion of said metal film, said solution including a surfactant, wherein the surfactant is mechanically rubbed out from a surface of the metal film and a metal oxide is made soluble to the solution having a pH and oxidation-reduction potential in the domain of corrosion of said metal film.

2. A polishing method according to claim 1, wherein said polishing solution has included therein less than 0.5 wt % of said polishing abrasive.

3. A polishing method according to claim 1, wherein said polishing solution is substantially free of said polishing abrasive.

4. A polishing method according to claim 1, wherein said surfactant is polyammoniumacrylate.

5. A polishing method according to claim 1, wherein said metal film is one selected from the group consisting of a copper film, a copper alloy film, and a copper compound film having copper as its principal component.

6. A polishing method for removing at least part of a metal film on an insulating film, comprising:
   chemically mechanically polishing the metal film using a polishing solution which additionally has included therein less than 1 wt % of a polishing abrasive, and includes an oxidizer, a substance which renders a metal oxide water-soluble, and a surfactant, said solution having a pH and oxidation-reduction potential in the domain of corrosion of said metal film, wherein the surfactant is mechanically rubbed out from a surface of the metal film and a metal oxide is made soluble to the substance for polishing the metal film.

7. A polishing method according to claim 6, wherein said polishing solution has included therein less than 0.5 wt % of said polishing abrasive.

8. A polishing method according to claim 6, wherein said polishing solution is substantially free of said polishing abrasive.

9. A polishing method according to claim 6, wherein said surfactant is polyammoniumacrylate.

10. A polishing method according to claim 6, wherein said metal film is one selected from the group consisting of a copper film, a copper alloy film, and a copper compound film having copper as its principal component.

11. A polishing method according to claim 6, wherein said metal film is one selected from the group consisting of a tungsten film, a tungsten alloy film, and a tungsten compound film having tungsten as its principal component.

12. A polishing method for removing at least part of a metal film on an insulating film, comprising:
   chemically mechanically polishing the metal film using a polishing solution which additionally has included therein less than 1 wt % of a polishing abrasive, and includes an oxidizer and malic acid, said solution, having a pH and oxidation-reduction potential in the domain of corrosion of said metal film, wherein the metal oxide is made soluble to the malic acid for polishing the metal film.

13. A polishing method according to claim 12, wherein said polishing solution has included therein less than 0.5 wt % of said polishing abrasive.

14. A polishing method according to claim 12, wherein said polishing solution is substantially free of said polishing abrasive.

15. A polishing method for removing at least part of a metal film on an insulating film, comprising:
   chemically mechanically polishing the metal film using a polishing solution which additionally has included therein less than 1 wt % of a polishing abrasive and includes an oxidizer, malic acid, and a surfactant, said solution having a pH and oxidation-reduction potential in the domain of corrosion of said metal film, wherein the surfactant is mechanically rubbed out from a surface of the metal film and a metal oxide is made soluble to the malic acid for polishing the metal film.

16. A method for manufacturing a semiconductor device, comprising:
   providing a substrate which includes a semiconductor;
   forming an insulating film on said substrate, said insulating film having an opening;
   forming a metal film inside said opening and overlying said insulating film; and
   polishing said metal film by chemical mechanical polishing using a polishing solution which additionally has included therein less than 1 wt % of a polishing abrasive, said solution having a pH and oxidation-reduction potential in the domain of corrosion of said metal film, said polishing solution including an oxidizer, a substance which renders a metal oxide water-soluble and a surfactant, wherein the surfactant is mechanically rubbed out from a surface of the metal film, and a metal oxide is made soluble to the substance for polishing the metal film.

17. A method for manufacturing a semiconductor device according to claim 16, wherein said polishing solution has included therein less than 0.5 wt % of said polishing abrasive.

18. A method for manufacturing a semiconductor device according to claim 16, wherein said polishing solution is substantially free of said polishing abrasive.

19. A method for manufacturing a semiconductor device according to claim 16, wherein said surfactant is polyammoniumacrylate.

20. A method for manufacturing a semiconductor device according to claim 16, wherein said metal film is one selected from the group consisting of a copper film, a copper alloy film, and a copper compound film having copper as its principal component.

21. A method for manufacturing a semiconductor device according to claim 16, wherein said metal film is one selected from the group consisting of a tungsten film, a tungsten alloy film, and a tungsten compound film having tungsten as its principal component.

22. A method for manufacturing a semiconductor device according to claim 16, further comprising:
   cleaning said substrate after the step of polishing said metal film, to provide a cleaned substrate, and drying said cleaned substrate.

23. A method for manufacturing a semiconductor device, comprising:
   providing a substrate which includes a semiconductor;
   forming an insulating film on said substrate, said insulating film having an opening;

forming a metal film inside said opening and overlying said insulating film; and polishing said metal film by chemical mechanical polishing using a polishing solution which additionally has included therein less than 1 wt % of a polishing abrasive, and includes malic acid, and a surfactant, said solution having a pH and oxidation-reduction potential in the domain of corrosion of said metal film, wherein the surfactant is mechanically rubbed out from a surface of said metal film and a metal oxide is made soluble to the malic acid for polishing the metal film.

24. A method for manufacturing a semiconductor device according to claim 23, wherein said polishing solution includes an oxidizer.

25. A method for manufacturing a semiconductor device according to claim 23, wherein said polishing solution has included therein less than 0.5 wt % of said polishing abrasive.

26. A method for manufacturing a semiconductor device according to claim 23, wherein said polishing solution is substantially free of said polishing abrasive.

27. A method of manufacturing semiconductor devices, comprising:

preparing a substrate having an impurity-doped layer;

forming an insulating film having an opening exposing said impurity-doped layer;

forming a layered film comprising a metal film having titanium nitride and copper as its principal components on the substrate on which said insulating film is formed;

mechanically rubbing a substance which suppresses etching or oxidation on said layered film surface by using a polishing solution comprising less than 0.01 wt % of an alumina polishing abrasive, hydrogen peroxide, citric acid or malic acid and a substance which suppresses etching or oxidation, said solution having a pH and oxidation-reduction potential in the domain of corrosion of said layered film.

* * * * *